(12) United States Patent
Yang et al.

(10) Patent No.: US 8,211,996 B2
(45) Date of Patent: Jul. 3, 2012

(54) WELL-DEFINED DONOR-ACCEPTOR ROD-COIL DIBLOCK COPOLYMER BASED ON P3HT CONTAINING $C_{60}$

(75) Inventors: Changduk Yang, Goleta, CA (US); Fred Wudl, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/592,486

(22) Filed: Nov. 25, 2009

(65) Prior Publication Data

US 2010/0137518 A1  Jun. 3, 2010

Related U.S. Application Data

(60) Provisional application No. 61/118,921, filed on Dec. 1, 2008.

(51) Int. Cl.
*C08G 75/00* (2006.01)

(52) U.S. Cl. ........ 528/380; 528/377; 528/373; 368/205; 505/460; 423/445 B

(58) Field of Classification Search .............. 528/380, 528/377, 373; 368/205; 505/460; 423/445 B
See application file for complete search history.

(56) References Cited

U.S. PATENT DOCUMENTS

2009/0108255 A1*   4/2009   Bazan et al. ................ 257/40

FOREIGN PATENT DOCUMENTS

WO       WO9801478      1/1998

OTHER PUBLICATIONS

Shaheen, S. E.; Ginley, D. S.; Jabbour, G. E. *MRS Bull.* 2005, 30, 10.
Günes, S.; Neugebauer, H.; Sariciftci, N. S. *Chem. Rev.* 2007, 107, 1324.
Kim, J.Y.; Kim, S. H.; Lee, H.-H.; Lee, K.; Ma, W.; Gong, X.; Heeger, A. J. *Adv. Mater.* 2006, 18, 572.
Li, G.; Shrotriya, V.; Huang, J.; Yao, Y.; Moriarty, T.; Emery, K.; Yang, Y. *Nature Mater.* 2005, 4, 864.
Ma, W.; Yang, C.; Gong, X.; Lee, K.; Heeger, A. J. *Adv. Funct. Mater.* 2005, 15, 1617.
Reyes-Reyes, M.; Kim, K.; Carroll, D. L. *Appl. Phys. Lett.* 2005, 87, 083506.
Yang, C.; Kim, J.Y.; Cho, S.; Lee, J. K.; Heeger, A. J.; Wudl, F. *J. Am. Chem. Soc.* 2008, 130, 6444.
Zhang, F. L.; Perzon, E.; Wang, X. J.; Mammo, W.; Andersson, M. R.; Inganäs, O. *Adv. Funct. Mater.* 2005, 15, 745.
Muhlbacher, D.; Scharber, M.; Morana, M.; Zhu, Z. G.; Waller, D.; Gaudiana, R.; Brabec, C. *Adv. Mater.* 2006, 18, 2931.

(Continued)

*Primary Examiner* — Randy Gulakowski
*Assistant Examiner* — Shane Fang
(74) *Attorney, Agent, or Firm* — Berliner & Associates

(57) ABSTRACT

A method for the synthesis of well-defined rod-coil block copolymers consisting of P3HT donor and $C_{60}$ acceptor chromophores (P3HT-b-P($S_xA_y$)-$C_{60}$) in a molecular architecture is reported for use in bulk-heterojunction (BHJ) solar cells. In thin films of the resulting block copolymer, reproducible self-assembly into well-defined "nanofibrils" is observed. This is the first example of a block copolymer containing a $C_{60}$ derivative that shows exclusively a nanofibrilar structure. A substantial improvement in device performance is achieved when the block copolymer is used as a "surfactant" for controlling the interface morphology of the P3HT:PCBM donor-acceptor phase domains within the composite.

17 Claims, 16 Drawing Sheets

OTHER PUBLICATIONS

Backer, S. A.; Sivula, K.; Kavulak, D. F.; Frechet, J. M. J. *Chem. Mater.* 2007, 19, 2927.
Peet, J.; Kim, J. Y.; Coates, N. E.; Ma, W. L.; Moses, D.; Heeger, A. J.; Bazan, G. C. *Nature Mater.* 2007, 6, 497.
Lee, J. K.; Ma, W. L.; Brabec, C. J.; Yuen, J.; Moon, J. S.; Kim, J. Y.; Lee, K.; Bazan, G. C.; Heeger, A. J. *J. Am. Chem. Soc.* 2008, 130, 3619.
Al-Ibrahim, M.; Ambacher, O.; Sensfuss, S.; Gobsch, G. *Appl. Phys. Lett.* 2005, 86, 201120.
Padinger, F.; Rittberger, R. S.; Sariciftci, N. S. *Adv. Funct. Mater.* 2003, 13, 85.
Chirvase, D.; Parisi, J.; Hummelen, J. C.; Dyakonov, V. *Nanotechnology* 2004, 15, 1317.
Yang, X. N.; Loos, J.; Veenstra, S. C.; Verhees, W. J. H.; Wienk, M. M.; Kroon, J. M.; Michels, M. A. J.; Janssen, R. A. J. *Nano Lett.* 2005, 5, 579.
Erb, T.; Zhokhavets, U.; Gobsch, G.; Raleva, S.; Stühn, B.; Schilinsky, P.; Waldauf, C.; Brabec, C. J. *Adv. Funct. Mater.* 2005, 15, 1193.
Klok, H. A.; Lecommandoux, S. *Adv. Mater.* 2001, 13, 1217.
Jenekhe, S. A.; Chen, X. L. *Science* 1998, 279, 1903.
Olsen, B. D.; Se galman, R. A. *Macromolecules* 2007, 40, 6922.
Lee, M.; Cho, B. K.; Zin, W. C. *Chem. Rev.* 2001, 101, 3869.
Gallot, B. *Prog. Polym. Sci.* 1996, 21, 1035.
Liu, J. S.; Sheina, E.; Kowalewski, T.; McCullough, R. D. *Angew. Chem., Int. Ed.* 2002, 41, 329.
Iovu, M. C.; Craley, C. R.; Jeffries-El, M.; Krankowski, A. B.; Zhang, R.; Kowalewski, T.; McCullough, R. D. *Macromolecules* 2007, 40, 4733.
Sivula, K.; Ball, Z. T.; Watanabe, N.; Frechet, J. M. J. *Adv. Mater.* 2006, 18, 206.
de Cuendias, A.; Le Hellaye, M.; Lecommandoux, B.; Cloutet, E.; Cramail, H. *J. Mater. Chem.* 2005, 15, 3264.
Radano, C. P.; Scherman, O. A.; Stingelin-Stutzmann, N.; Müller, C.; Breiby, D. W.; Smith, P.; Janssen, R. A. J.; Meijer, E. W. *J. Am. Chem. Soc.* 2005, 127, 12502.
van der Veen, M. H.; de Boer, B.; Stalmach, U.; van de wetering, K. I.; Hadziioannou, G. *Macromolecules* 2004, 37, 3673.
Stalmach, U.; de Boer, B.; Videlot, C.; van Hutten, P. F.; Hadziioannou, G. *J. Am. Chem. Soc.* 2000, 122, 5464.
Barrau, S.; Heiser, T.; Richard, F.; Brochon, C.; Ngov, C.; van de Wetering, K.; Hadziioannou, G.; Anokhin, D. V.; Ivanov, D. A. *Macromolecules* 2008, 41, 2701.
de Boer, B.; Stalmach, U.; van Hutten, P. F.; Melzer, C.; Krasnikov, V. V.; Hadziioannou, G. *Polymer* 2001, 42, 9097.
Chiefari, J.; Chong, Y. K.; Ercole, F.; Krstina, J.; Jeffery, J.; Le, T. P. T.; Mayadunne, R. T. A.; Meijs, G. F.; Moad, C. L.; Moad, G.; Rizzardo, E.; Thang, S. H. *Macromolecules* 1998, 31, 5559.
Krasovskiy, A.; Knochel, P. *Angew. Chem., Int. Ed.* 2004, 43, 3333.
Jeffries-El, M.; Sauvé, G.; McCullough, R. D. *Macromolecules* 2005, 38, 10346.
Stenzel, M. H.; Davis, T. P.; Fane, A. G. *J. Mater. Chem.* 2003, 13, 2090.
Camp, A. G.; Lary, A.; Ford, W. T. *Macromolecules* 1995, 28, 7959.
Tan, Z.; Hou, J. H.; He, Y. J.; Zhou, E. J.; Yang, C. H.; Li, Y. F. *Macromolecules* 2007, 40, 1868.
Ruoff, R. S.; Tse, D. S.; Malhotra, R.; Lorents, D. C. *J. Phys. Chem.* 1993, 97, 3379.
Beck, M. T.; Mándi, G. *Fullerene Sci. Technol.* 1997, 5, 291.
Liu, B.; Bunker, C. E.; Sun, Y. P. *Chem. Commun.* 1996, 1241.
Spanggaard, H.; Krebs, F. C. *Sol. Energ. Mat. Sol. C.* 2004, 83, 125.
Bahadur, P. *Curr. Sci. India* 2001, 80, 1002.
Ni, P. H.; Zha ng, M. Z.; Zhuge, L. J.; Fu, S. K. *J. Polym. Sci. Pol. Chem.* 2002, 40, 3734.
Richard, F.; Brochon, C.; Heiser, T.; Nicolas Leclerc, . *Macromol Rapid Commun* 2008, 29, 885-891.

\* cited by examiner

| compound | mol% P3HT$^a$ | mol% PS$^a$ | Mol% PA$^a$ | $M_n^b$ | PDI$^b$ |
|---|---|---|---|---|---|
| P3HT | 100 | 0 | 0 | 8350 | 1.11 |
| P3HT-$b$-P(S$_6$A$_4$)-C$_{60}$ | 16.7 | 51.6 | 31.7 | 23100 | 1.59 |
| P3HT-$b$-P(S$_8$A$_2$)-C$_{60}$ | 12.0 | 71.1 | 16.8 | 18500 | 1.61 |

$^a$Determined by $^1$H NMR. $^b$Estimated from GPC (eluent = THF, polystyrene standard).

FIG. 2

WELL-DEFINED DONOR-ACCEPTOR ROD-COIL DIBLOCK COPOLYMER BASED ON P3HT CONTAINING $C_{60}$

CROSS-REFERENCE TO RELATED APPLICATIONS

This application claims the benefit of U.S. Provisional Patent Application No. 61/118,921 filed Dec. 1, 2008, which is hereby incorporated by reference in its entirety.

FIELD OF THE INVENTION

The invention generally relates to organic photovoltaic devices (OPV) based on π-conjugated polymer and fullerene composites. More particularly, the invention relates to a process for the synthesis of and devices incorporating well-defined donor-acceptor rod-coil diblock copolymer based on P3HT containing $C_{60}$ (P3HT-b-P($S_xA_y$)-$C_{60}$).

BACKGROUND OF THE INVENTION

Organic photovoltaic devices (OPV) based on π-conjugated polymer and fullerene composites, so-called "bulk heterojunction (BHJ)", offer an intrinsically low-cost, scalable approach to photovoltaic technology.[1,2] Important examples of materials used for fabricating BHJ solar cells include blends of thiophene-based polymers as electron-donors (D) and fullerene derivatives as a electron-acceptors (A).[3-10] Synthetic effort has focused on improving the power conversion efficiencies (PCE) by means of development of low band-gap polymers[8,9] and fullerene derivatives.[7,10] With the goal of obtaining improved performance, control of the morphology within the BHJ material has utilized processing additives,[11,12] different solvents (and mixed solvents),[13] and thermal annealing.[14-17] These different methods attempt to facilitate the phase separation on length scales of a few nanometers in the devices[4,16]

Rod-coil di-(AB-type) copolymers constitute a class of macromolecules that can be uniquely fashioned into self-assembled nanostructures in which the rod blocks align along their long axes into nanoscaled domains, often creating liquid crystalline mesophases.[18-23] Therefore, in case of the rod-coil block copolymers containing a rigid conjugated polymer segment as a rod block, their ability to self-organize can be used optimize the morphology in OPV devices.

Reports on rod-coil block copolymers based on P3HT rod and polyolefin coil by using living radical polymerization techniques have established the existence of nanofibrilar structures in the solid state.[24-28] Although there are reports of synthesis directed toward soluble donor-acceptor rod-coil diblock copolymers containing $C_{60}$ for use as the active layer in solar cells,[29-32] the difficulty in removing unreacted $C_{60}$ has limited the success of this approach. Moreover, these soluble donor-acceptor rod-coil diblock copolymers containing $C_{60}$ have not been reported with an exclusive nanofibrilar structure.

Recently, Fréchet et al. have demonstrated the synthesis of a well-defined donor-acceptor amphiphilic diblock copolymer by using ring-opening metathesis polymerization (ROMP). They showed that the diblock copolymer can play a critical role in tuning the device morphology when employed as an additive, leading to stabilization of the device structure against destructive thermal phase segregation.[26] Thus, the synthesis and characterization of well-defined "donor-acceptor rod-coil" diblock copolymers promises to be of use in obtaining self-assembled nanostructures in materials for OPV.

BRIEF SUMMARY OF THE INVENTION

The present invention overcomes the foregoing drawbacks. In contrast to the above-described, a process for the synthesis of a block copolymer is now provided containing a $C_{60}$ derivative that shows exclusively a nanofibrilar structure. Also provided are devices with improved performance and efficiency when the block copolymer is used as a "surfactant" for controlling the interface morphology of the P3HT:PCBM donor-acceptor phase domains within the composite.

In one embodiment diblock is provided comprising the formula of P3HT-b-P($S_xA_y$)-$C_{60}$, wherein S is styrene and A is acrylate, x is the mol ratio of S and y is the mol ratio of A in the copolymer, whereby the diblock is sufficiently soluble to be cast as a thin film.

In another embodiment, a comprising the formula of P3HT-b-P($S_xA_y$)-$C_{60}$ is provided that expresses a nanofibrilar structure.

In a more particularized embodiment, a compound is provided comprising P3HT-b-P($S_xA_y$)-$C_{60}$, wherein % mol of P3HT is 10-20, % mol of PS is 50-80, % mol of PA is 10-40, and % wt of $C_{60}$ is 30-50.

In yet another embodiment, a device is provided comprising a compound comprising 1-10% wt of P3HT, 0.1-10% wt of PCBM in 0.1-5% wt solution, 1-20% wt of P3HT-b-P($S_xA_y$)-$C_{60}$ per the amount of P3HT.

In another embodiment a method for the synthesis of P3HT-b-P($S_xA_y$)-$C_{60}$ diblock is provided, comprising undergoing a living polymerization reaction and performing cycloaddition reactions. In yet a more particularized embodiment, the aforementioned method produces a diblock with a nanofibrilar structure.

BRIEF DESCRIPTION OF THE DRAWINGS

For a more complete understanding of the present invention, reference is now made to the following descriptions taken in conjunction with the accompanying drawing, in which:

FIG. 2 is a table showing the characteristics of P3HT-b-P($S_xA_y$)-$C_{60}$.

DETAILED DESCRIPTION OF THE INVENTION

Figure 1:
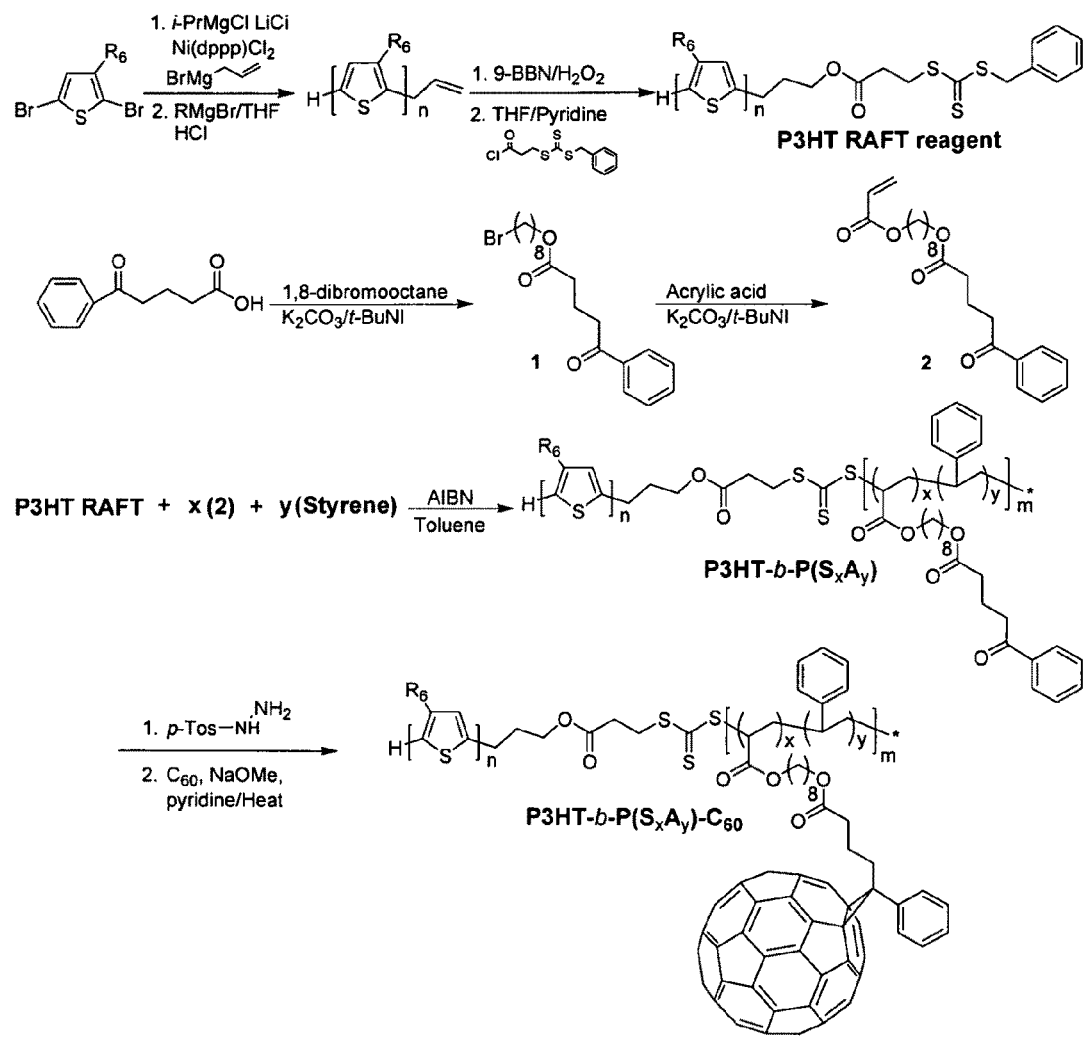
FIG. 1 shows a scheme for the synthetic approach towards the donor-acceptor rod-coil diblock copolymer (P3HT-b-P($S_xA_y$)-$C_{60}$).

Among various living polymerization methods, reversible addition fragmentation chain transfer (RAFT) was selected for the synthesis of the rod-coil block copolymer containing polyolefin since it does not involve the use of a transition metal catalyst.[33,34] This protocol is applicable to a whole range of monomers.[35] The synthetic method is outlined in FIG. 1. The polymerization of 2,5-dibromo-3-hexylthiophene was performed by (GRIM) reaction with i-PrMgCl.LiCl/nickel catalyst[36], followed by the treatment of a second Grignard reagent (allyl magnesium bromide), resulting in the mono end-capped P3HT ($M_n$=8.3 kg/mol, PDI=1.11, against PS standard). This is a slight synthetic modification of McCullough's method.[25] The allyl-mono-capped P3HT typically contained two populations, one major and one minor, which correspond to allyl/Br and allyl/H respectively.[37] To completely rule out the halogen defect on electronic applications, the allyl/Br fractions in the polymer were debrominated by a Grignard reaction and quenched with water to give well-defined mono capped P3HT (allyl/H). The allyl end group was easily converted to hydroxypropyl mono-terminated P3HT and then treated with 3-benzylsulfanylthiocarbonylsulfanylpropionic acid chloride,[38] yielding a trithiocarbonate macro-RAFT agent based on P3HT.[25]

The fullerene-containing block must retain a large degree of freedom for the fullerenes to be able to interact with each other with minimum inhibition. This requires a long, flexible tether to ameliorate the rigidity imposed by the backbone. Therefore, an acrylate monomer 2 with a very flexible tether was designed for the route to functionalization through the addition of diazo compounds to Buckminsterfullerene (FIG. 1). The ketone compound 1 was prepared by esterification of 4-benzoylbutyric acid with 1,8-dibromooctane in the presence of potassium carbonate and subsequently coupled with acrylic acid via second esterification to generate the desirable acrylate monomer 2 in 60% overall yield (two steps). To avoid the radical incorporation of $C_{60}$,[39] the synthetic approach generated the target block copolymer via initial polymerization and subsequent polymer-analogous reaction with $C_{60}$.

To prepare a soluble methanofullerene-polyolefin linkage with a "charm bracelet" type pendent fullerene structure, various polyketones with long flexible chains were synthesized in our initial synthetic attempts. These resulting polymers were converted to the corresponding polytosylhydrazones, and these were allowed to react with $C_{60}$. Unfortunately, however, soluble polymers could not be isolated. A likely rationale for this result is the occurrence of crosslinking via the multifunctionality of $C_{60}$. Therefore, we settled on styrene units as an unreactive group that can suppress the crosslinking and act as a flexible and inert spacer between the balls, presumably resulting in soluble polymers with $C_{60}$.

With this in mind, statistical copolymers with different feed ratio of styrene to 2 were prepared and subsequently tested the functionalization with $C_{60}$. Depending on the degree of the styrene feed, this did, indeed, create a solution-processable "charm bracelet" polymer containing $C_{60}$.

Rod-coil diblock copolymers based on P3HT (P3HT-b-P(S$_x$A$_y$)) with feed ratio of styrene to acrylate monomer 2 (x:y, 6:4 and 8:2 mol %, respectively) were synthesized via RAFT polymerization (FIG. 1). The table in FIG. 2 summarizes the physical properties and composition as determined by $^1$H NMR and GPC.

Condensation of the polyketones with p-tosylhydrazide in THF generated the corresponding precursor polytosylhydrazones, which after sequential treatment with sodium methoxide in pyridine and $C_{60}$ in refluxing o-dichlorobenzene (o-DCB) gave the donor-acceptor rod-coil diblock copolymers (P3HT-b-P(S$_6$A$_4$)-C$_{60}$ and P3HT-b-P(S$_8$A$_2$)-C$_{60}$), respectively. According to the reported purification to remove unreacted $C_{60}$,[40] the crude polymer was subjected to Soxhlet extraction with hexane for 7 days. However, thin layer chromatography (TLC) showed the presence of a sizable amount of unreacted $C_{60}$. It was also reported that the solubility of $C_{60}$ in THF is negligible.[41,42] Thus, as an alternative purification, the crude compound was redissolved in a large amount of THF and filtered to remove any unreacted $C_{60}$. The procedure was repeated five times, and the polymer was filtered through a micron filter (0.45 μm) twice. Despite several filtrations, a trace amount of $C_{60}$ was still observed by TLC, an observation at odds with the report by Hadziioannou et al.[29,30] For further purification, the crude product was repeatedly dissolved (about five times) in o-dichlorobenzene (o-DCB) and precipitated into hot hexane, until any trace (via TLC) of the unreacted $C_{60}$ was removed. The P3HT-b-P(S$_8$A$_2$)-C$_{60}$ is readily soluble in organic solvents (THF, toluene, chlorobenzene, o-DCB, etc) whereas P3HT-b-P(S$_6$A$_4$)-C$_{60}$ shows, after complete drying, exhibited only limited solubility. This has also been observed by other groups[29,43] and currently lacks a logical explanation. However, it most likely arises from strong interdigitation between the polymer backbone and $C_{60}$ in the solid state due to the high content of $C_{60}$. The low solubility of P3HT-b-P(S$_6$A$_4$)-C$_{60}$ limited the NMR characterization. Inspection of $^1$H NMR spectrum of P3HT-b-P(S$_8$A$_2$)-C$_{60}$, showed that the signal from hydrogen (N=CCH$_2$—) adjacent to tosylhydrazone unit in the precursor polymer at δ=2.64 ppm completely vanished, and a new peak (ca. δ=3.07 ppm) associated with the hydrogen (Ph-CCH$_2$—) on neighboring $C_{60}$ appeared. Also, in the $^{13}$C NMR spectrum a broad set of resonances were observed between 137 and 148, with the characteristic sharp peak at 143 ppm that arises from unreacted $C_{60}$ being absent (see Supporting Information).

Figure 3:
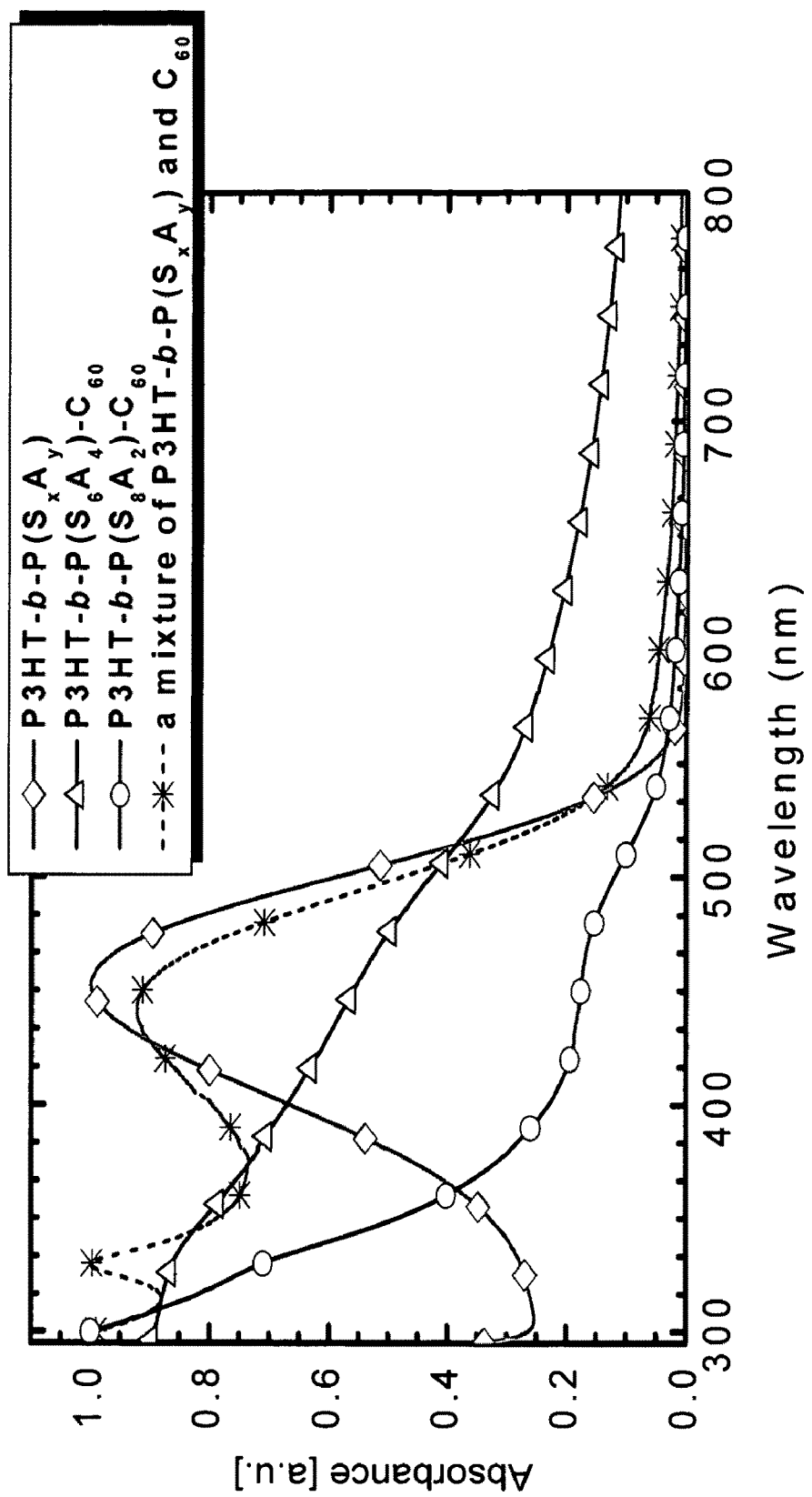
FIG. 3 shows a UV-Vis absorption spectra of the copolymers in $CHCl_3$. (-◇-; P3HT-b-P($S_xA_y$), -*-; a mixture of P3HT-b-P($S_xA_y$), and $C_{60}$, -Δ-; P3HT-b-P($S_6A_4$)-$C_{60}$, -○-; P3HT-b-P($S_8A_2$)-$C_{60}$).

FIG. 3 depicts the UV-Vis absorption spectra of P3HT-b-P(S$_x$A$_y$), a mixture of P3HT-b-P(S$_x$A$_y$) and $C_{60}$, and the donor-acceptor diblock copolymers (P3HT-b-P(S$_6$A$_4$)-C$_{60}$ and P3HT-b-P(S$_8$A$_2$)-C$_{60}$) in solution in chloroform. To precisely clarify the effect of Buckminsterfullerene functionalization on the absorption features, P3HT-b-P(S$_x$A$_y$) and the mixed P3HT-b-P(S$_x$A$_y$) and $C_{60}$ solutions were also investigated. While P3HT-b-P(S$_x$A$_y$) displayed no absorption at around 330 nm, P3HT-b-P(S$_6$A$_4$)-C$_{60}$ and P3HT-b-P(S$_8$A$_2$)-C$_{60}$ exhibited a shoulder band around 330 nm, arising from absorbed $C_{60}$. Hadziioannou et al. claimed that fullerene polymers exhibit a distinguishable sharp band at 330 nm.[30]

However, such an optical feature is only observed in the case of the polymer containing unreacted $C_{60}$ (see a mixture of P3HT-b-P($S_xA_y$) and $C_{60}$ in FIG. 3).

In the case of P3HT-b-P($S_6A_4$)-$C_{60}$, only a long tailing band into the visible part of the spectrum was observed, presumably originating from the scattering of the particles in the solution due to limited solubility. The absorption bands centered at 453 nm that originate from the P3HT segment in P3HT-b-P($S_6A_4$)-$C_{60}$ and P3HT-b-P($S_8A_2$)-$C_{60}$ are dramatically reduced, compared to P3HT-b-P($S_xA_y$). This can be ascribed to the decrease of relative amount of P3HT segment per weight of diblock copolymer containing $C_{60}$ relative to that of P3HT-b-P($S_xA_y$).

Figure 4:
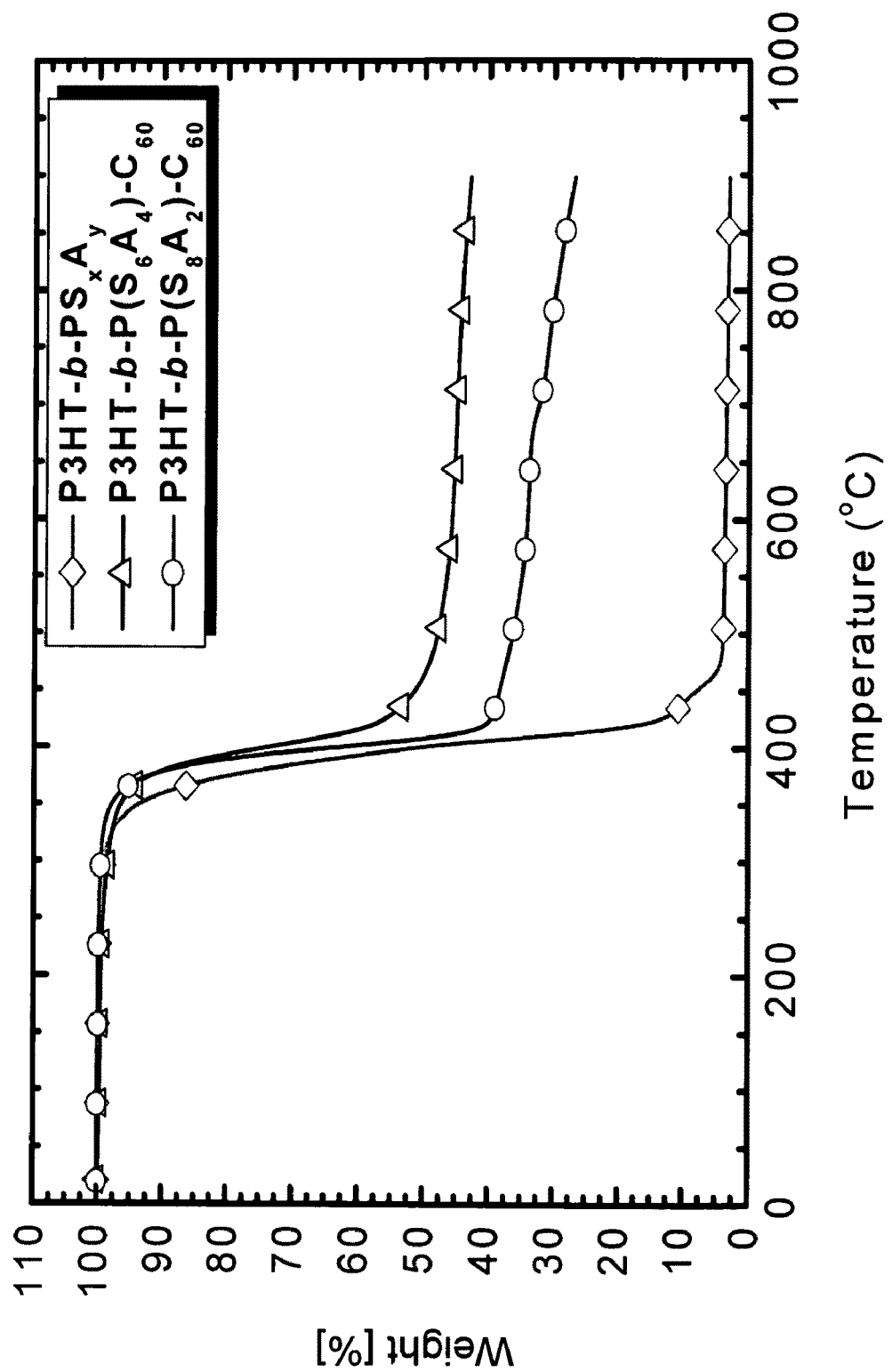
FIG. 4 shows a TGA of P3HT-b-P($S_xA_y$), P3HT-b-P($S_6A_4$)-$C_{60}$, and P3HT-b-P($S_8A_2$)-$C_{60}$ under $N_2$. Heating rate 10° C./min.

The $C_{60}$ content obtained from the TGA (see FIG. 4) usually shows a somewhat higher value since crosslinking of polymer can occur upon heating, resulting in a larger residue.[30] However, the TGA is still a reliable technique to verify the amount of $C_{60}$ in the polymers. The P3HT-b-P($S_xA_y$) completely decomposed when heated up to 550° C., leaving residues at this temperature on the order of 47 and 35 wt. % for P3HT-b-P($S_6A_4$)-$C_{60}$ and P3HT-b-P($S_8A_2$)-$C_{60}$, respectively. These results confirm that the donor-acceptor diblock copolymers contain substantial amounts of $C_{60}$. Broadly, the values can also be considered as the corresponding $C_{60}$ content since the pure $C_{60}$ is stable up to 550° C.

Figure 5:
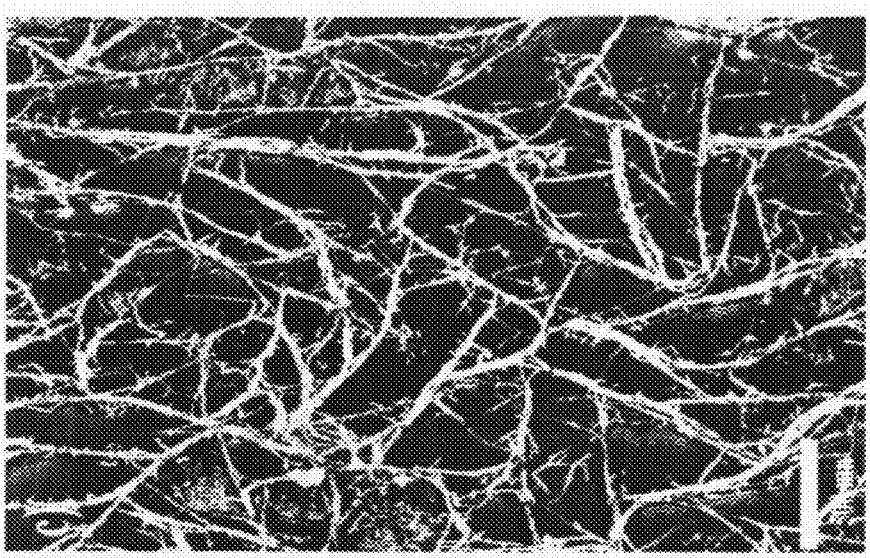
FIG. 5 shows a UV-Vis absorption spectrum (a) and tapping mode AFM images (height (b), phase (c)) of the P3HT-b-P($S_8A_2$)-$C_{60}$ pristine film.
Figure 5:
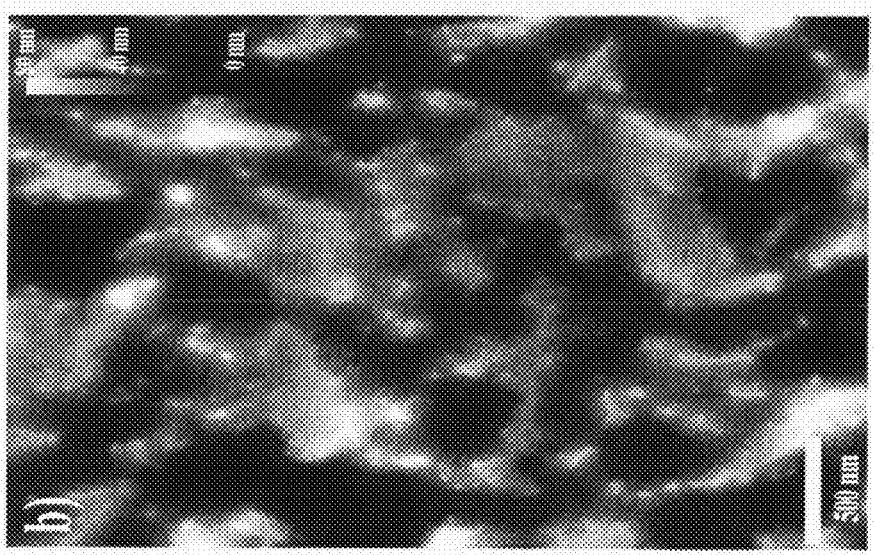
Figure 5:
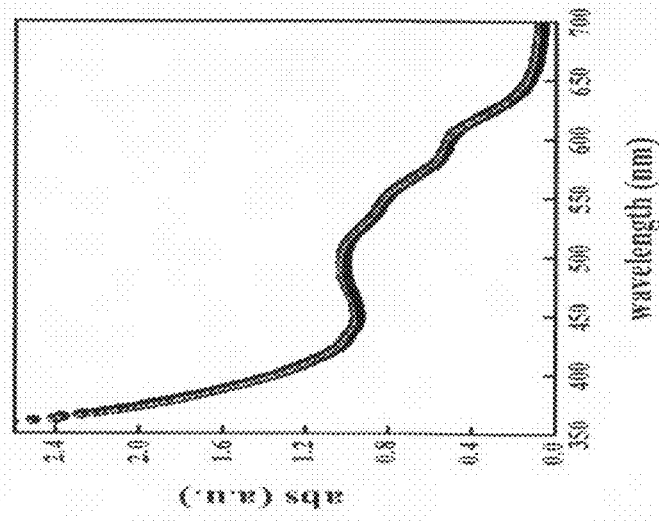

Only the P3HT-b-P($S_8A_2$)-$C_{60}$ was investigated in detail for device fabrication since the poor solubility of P3HT-b-P($S_6A_4$)-$C_{60}$ prevented deposition of thin films. The UV-Vis spectrum of the block copolymer was recorded from thin films obtained by spin-casting from chlorobenzene solution (5 wt. %). A pronounced bathochromic shift (~50 nm) is not only observed but the intensity of the π-π* transition band also increased relative to that in solution, indicating the presence of P3HT chain ordering within the rod building block in the solid state (FIG. 5a).

Tapping mode atomic force microscopy (AFM) was employed to investigate the surface topography. FIGS. 5b and 5c show the height and corresponding phase images for P3HT-b-P($S_8A_2$)-$C_{60}$ pristine film cast from chlorobenzene. Surprisingly, despite having a bulky, rigid $C_{60}$ in the coil block, typical features are clearly visualized by AFM as very well defined micron-sized "nanofibrils". This is the first time that a rod-coil block copolymer with $C_{60}$ units was observed to exhibit long nanofibrilar structures.

Such supramolecular organization is in good agreement with our concept that P3HT-b-P($S_8A_2$)-$C_{60}$ can allow controlled assembly into unique morphologies. Therefore, it is possible to replace the traditional BHJ system (P3HT:PCBM) by P3HT-b-P($S_8A_2$)-$C_{60}$ containing ordered donor- and acceptor-type moieties in a single framework, a novel architecture for OPV devices. Applications of P3HT-b-P($S_8A_2$)-$C_{60}$ in solar cells and field-effect transistors (FET) were explored in preliminary studies, but showed disappointing device performance. This is most likely a result of large amounts of insulating moieties such as styrene units and long flexible chains in the coil segments that were required for solubility.

Exciton dissociation in the BHJ solar cells occurs at the interface between the two immiscible components (P3HT and PCBM). Thus, the strategy toward improving miscibility between the P3HT and PCBM domains implies phase separation with a large interfacial area, resulting in higher performance of BHJ devices.[26,44] These ideas prompted us to utilize P3HT-b-P($S_8A_2$)-$C_{60}$ as a "surfactant" for improved self-organization of the two ingredients (e.g. P3HT and PCBM). Traditionally, diblock copolymers can play a critical role in compatibilizing immiscible pairs in the condensed phases.[26,45]

Figure 6:
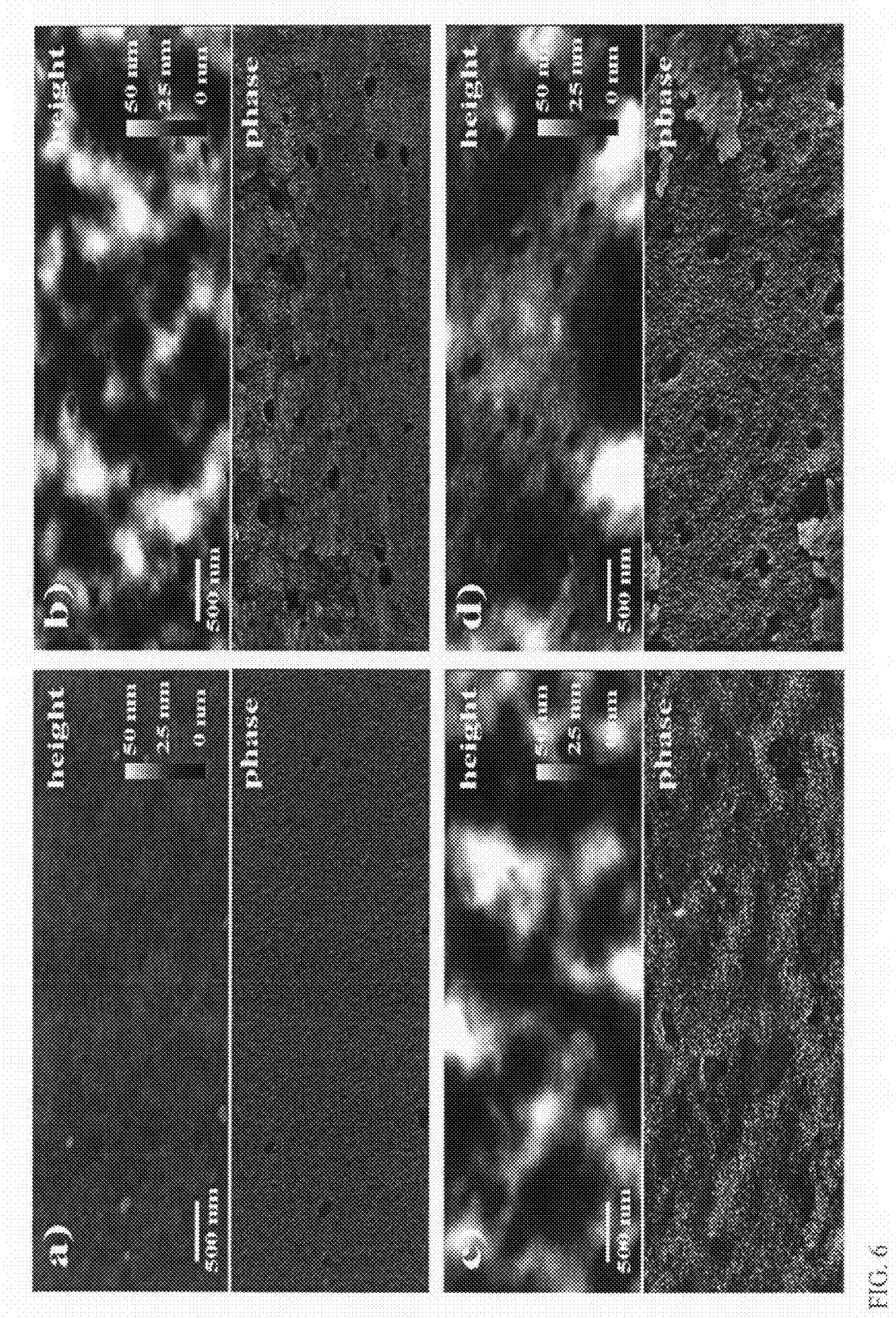
FIG. 6 shows tapping mode AFM images of P3HT:PCBM (1:0.7 w/w) BHJ films processed with P3HT-b-P($S_8A_2$)-$C_{60}$; none (a), 5 wt. % (b), 10 wt. % (c), and 20 wt. % (d).

The effectiveness of the diblock copolymer surfactants is sensitive to their concentration in the immiscible systems.[45,46] Thus, BHJ films (P3HT:PCBM, at weight ratio (1:0.7 w/w)) with the addition of various P3HT-b-P($S_8A_2$)-$C_{60}$ concentrations (0, 5, 10, and 20 wt. %, respectively) were prepared by casting from chlorobenzene at 300 rpm, followed by slow evaporation at room temperature for 10 min. Although a P3HT:PCBM weight ratio of 1:0.7 w/w was used, other ratios of P3HT:PCBM can be used such as, but not limited to 1:1, 1:1.2, and 1:4. Note that the slow drying process was necessary to allow the P3HT-b-P($S_8A_2$)-$C_{60}$ to behave as a morphology modifier in the blend film. The as-cast film of P3HT:PCBM shows a smooth surface. Upon adding 5 wt. % P3HT-b-P($S_8A_2$)-$C_{60}$ to the blend mixture, the film constituents diffuse and the phase domains increased in size (FIG. 6b). A rationale for this feature is migration of the block copolymer as a surfactant into the interface between P3HT and PCBM, resulting in the improved miscibility of the P3HT and PCBM. As the amount of P3HT-b-P($S_8A_2$)-$C_{60}$ increased in the blend, up to 20 wt. %, detectable phase segregation, most likely attributed to the further enhancement of compatibility between P3HT and PCBM components, was observed.

Figure 7:
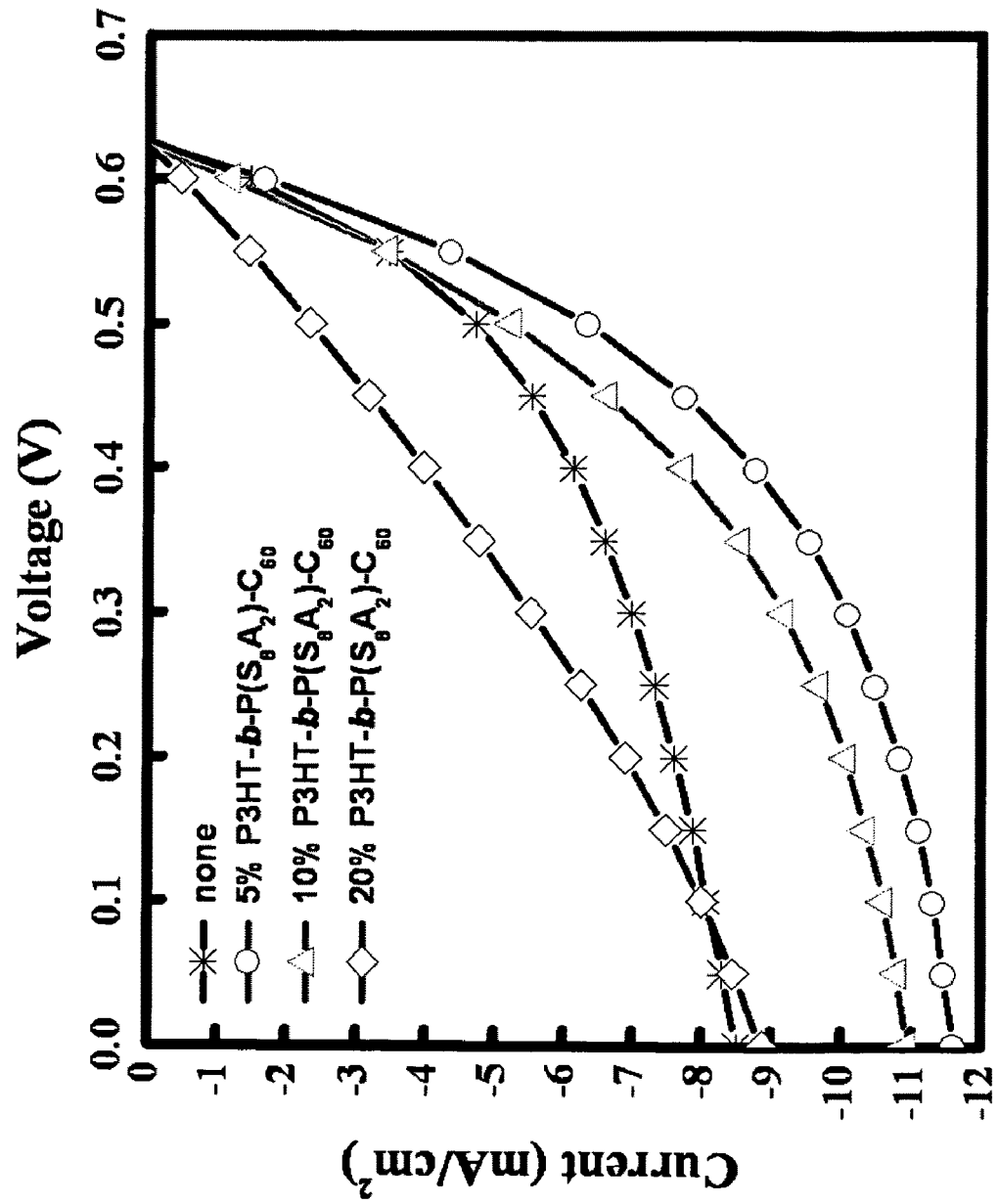
FIG. 7 shows current (J)-voltage (V) characteristics of P3HT:PCBM composite films with P3HT-b-P($S_8A_2$)-$C_{60}$ additives: (a) none (black), (b) 5 wt. % (red), (c) 10 wt. % (green), (d) 20 wt. % (blue).
Figure 8:
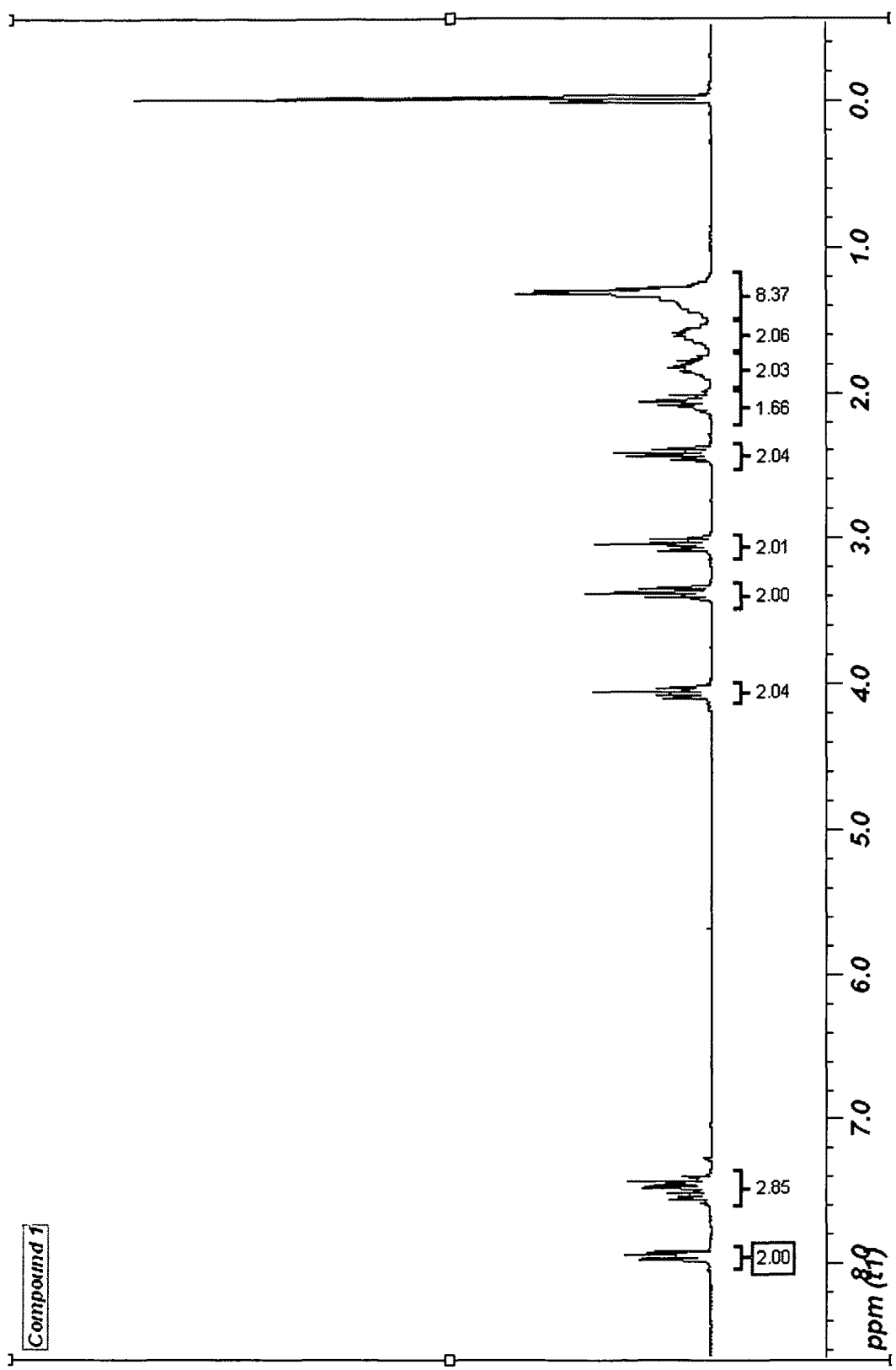
FIG. 8 shows $^1H$ and $^{13}C$ NMR spectra of compound 1.
Figure 9:
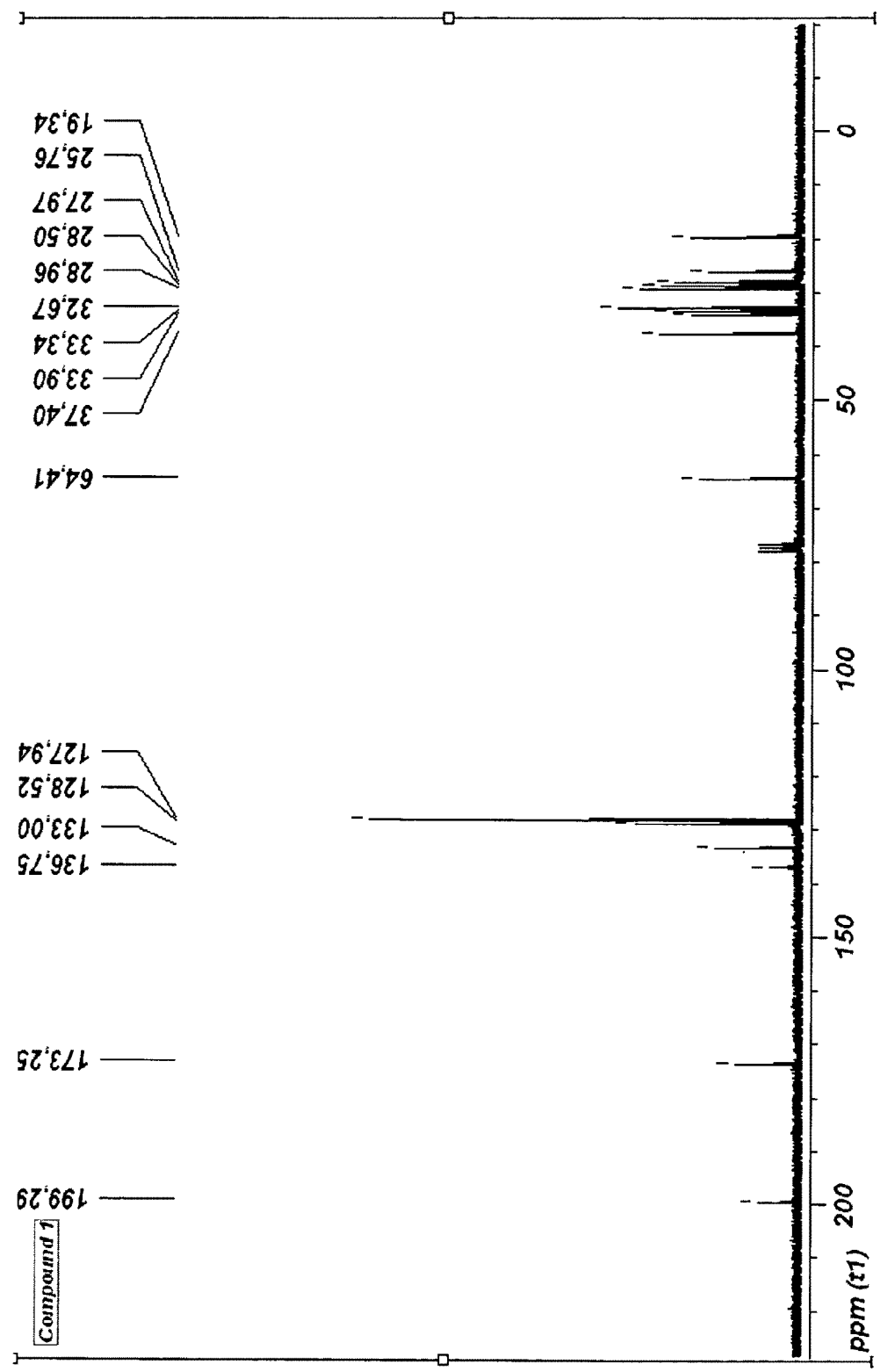
FIG. 9 shows a $^1$H and $^{13}$C NMR spectra of compound 1 (continued).
Figure 10:
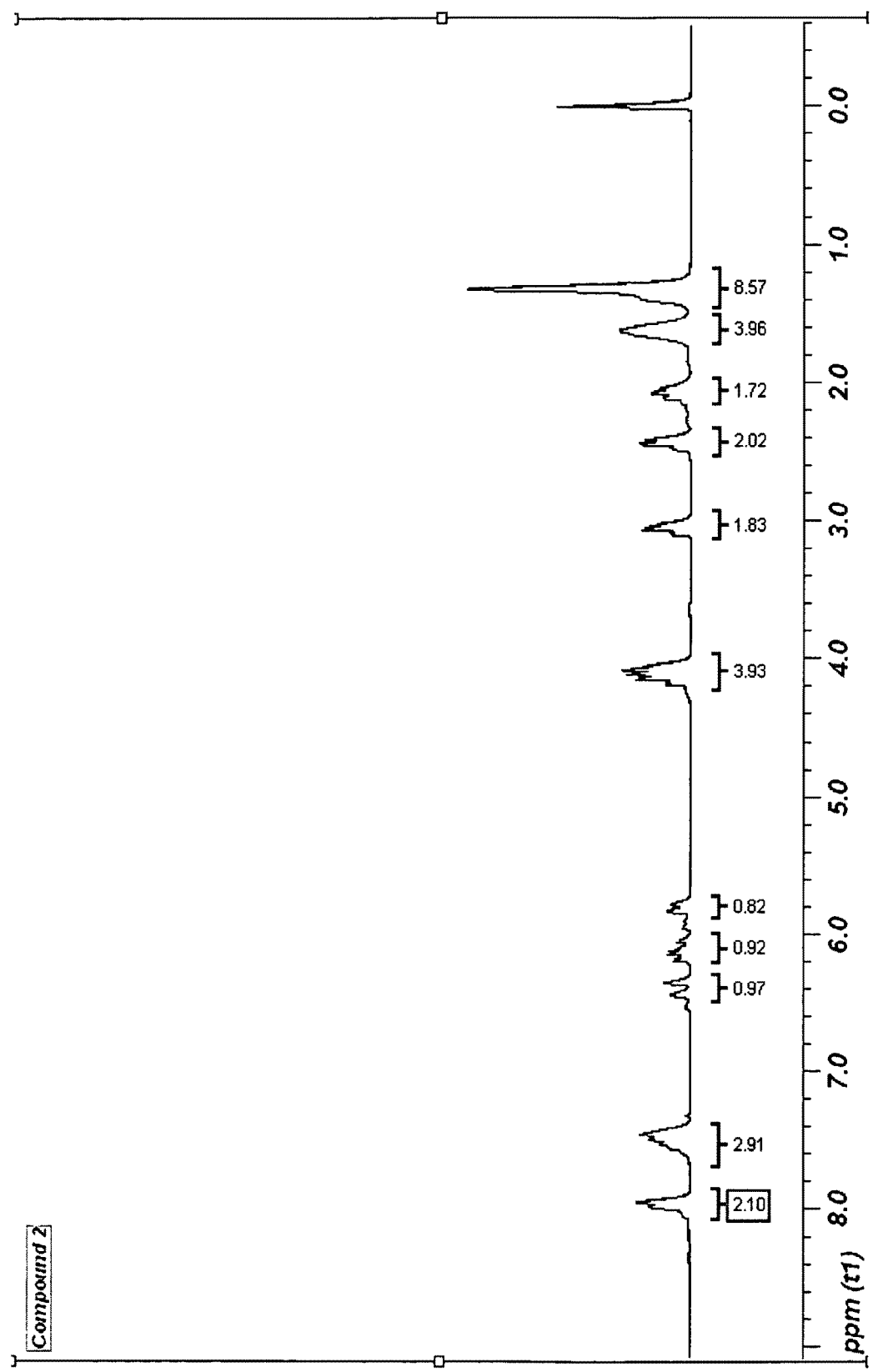
FIG. 10 shows a $^1$H and $^{13}$C NMR spectra of compound 2.
Figure 11:
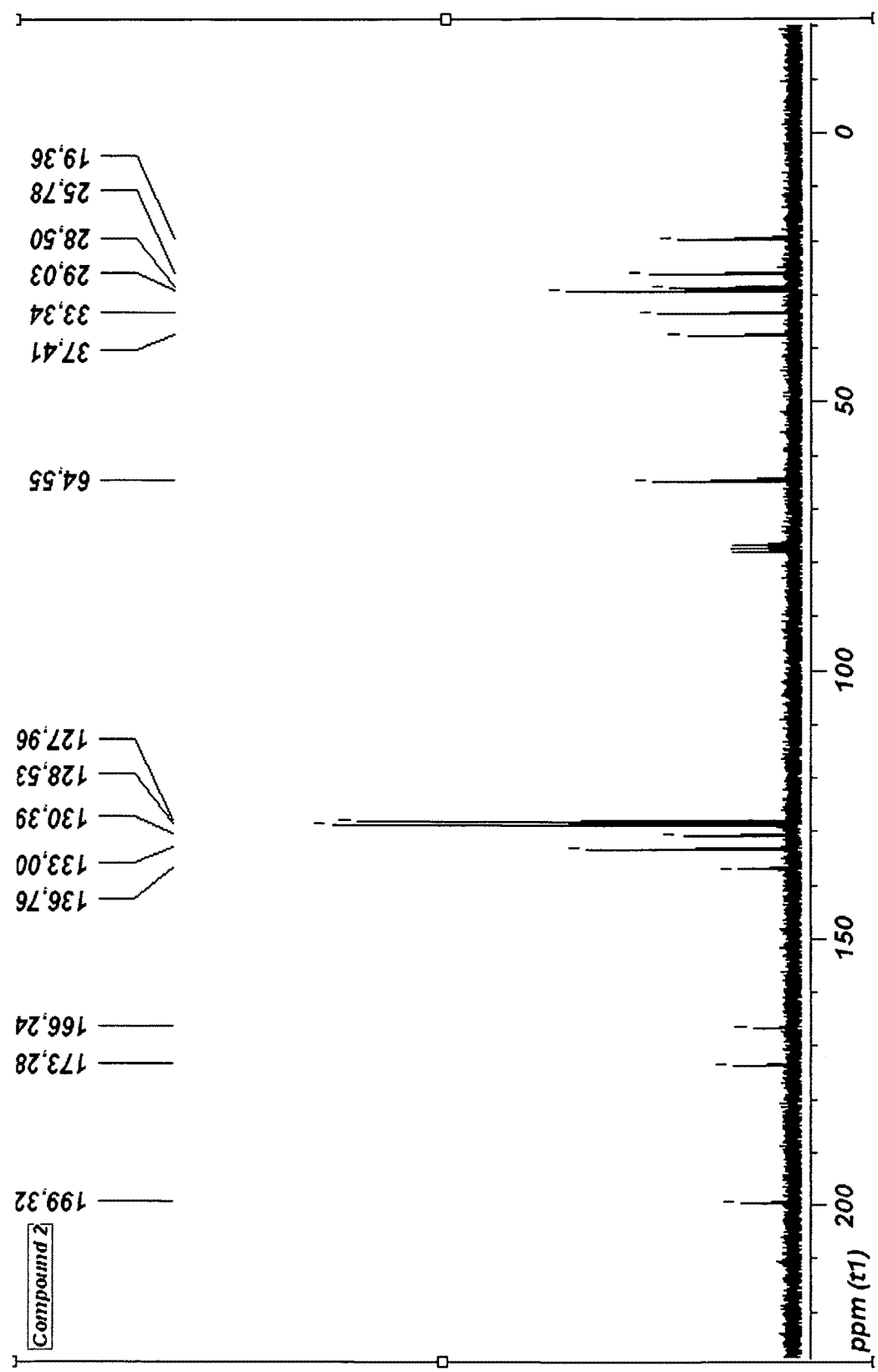
FIG. 11 shows a $^1$H and $^{13}$C NMR spectra of compound 2 (continued).
Figure 12:
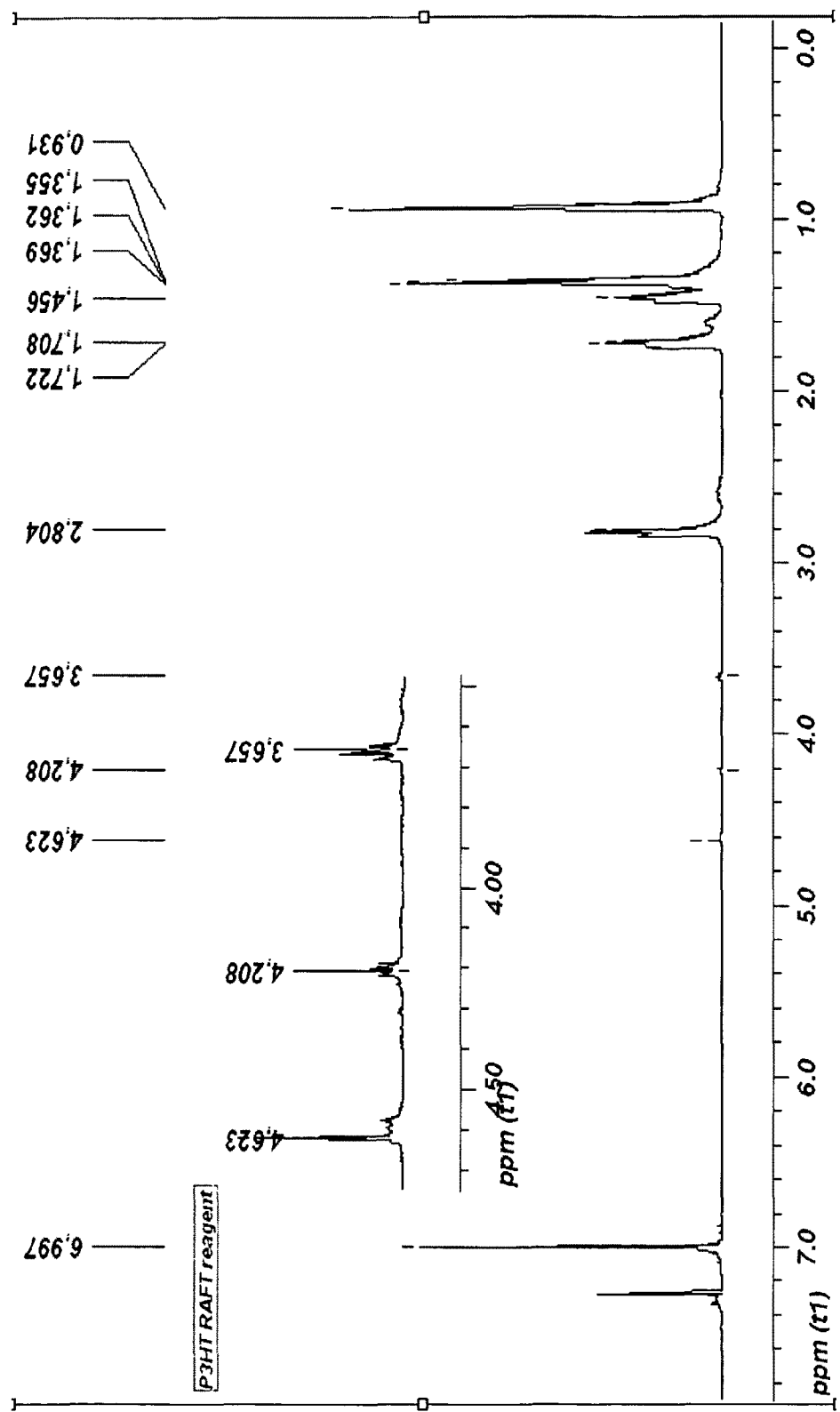
FIG. 12 shows a $^1$H and $^{13}$C NMR spectra of the P3HT RAFT Reagent.
Figure 13:
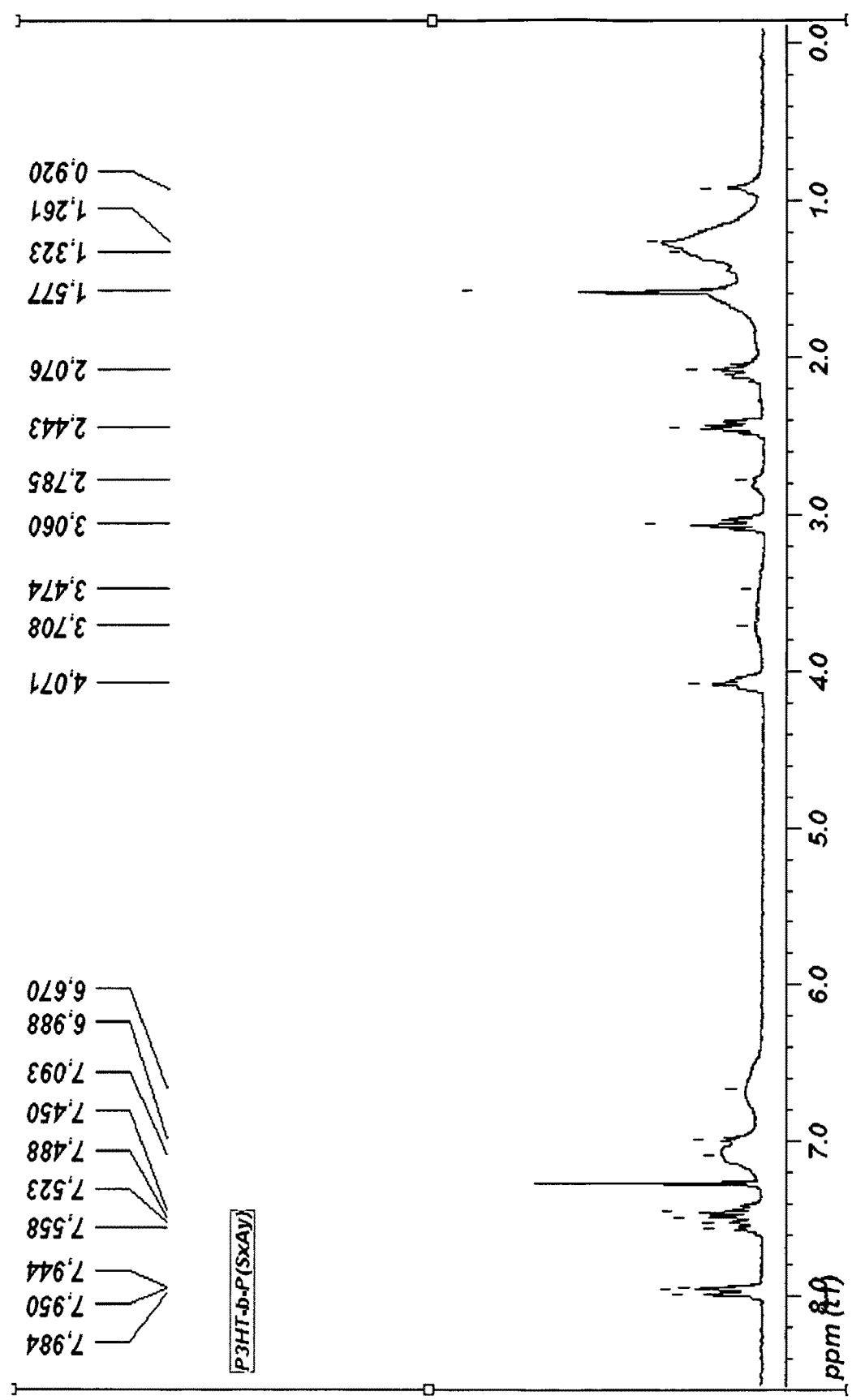
FIG. 13 shows a $^1$H and $^{13}$C NMR spectra of P3HT-b-P(S$_x$A$_y$).
Figure 14:
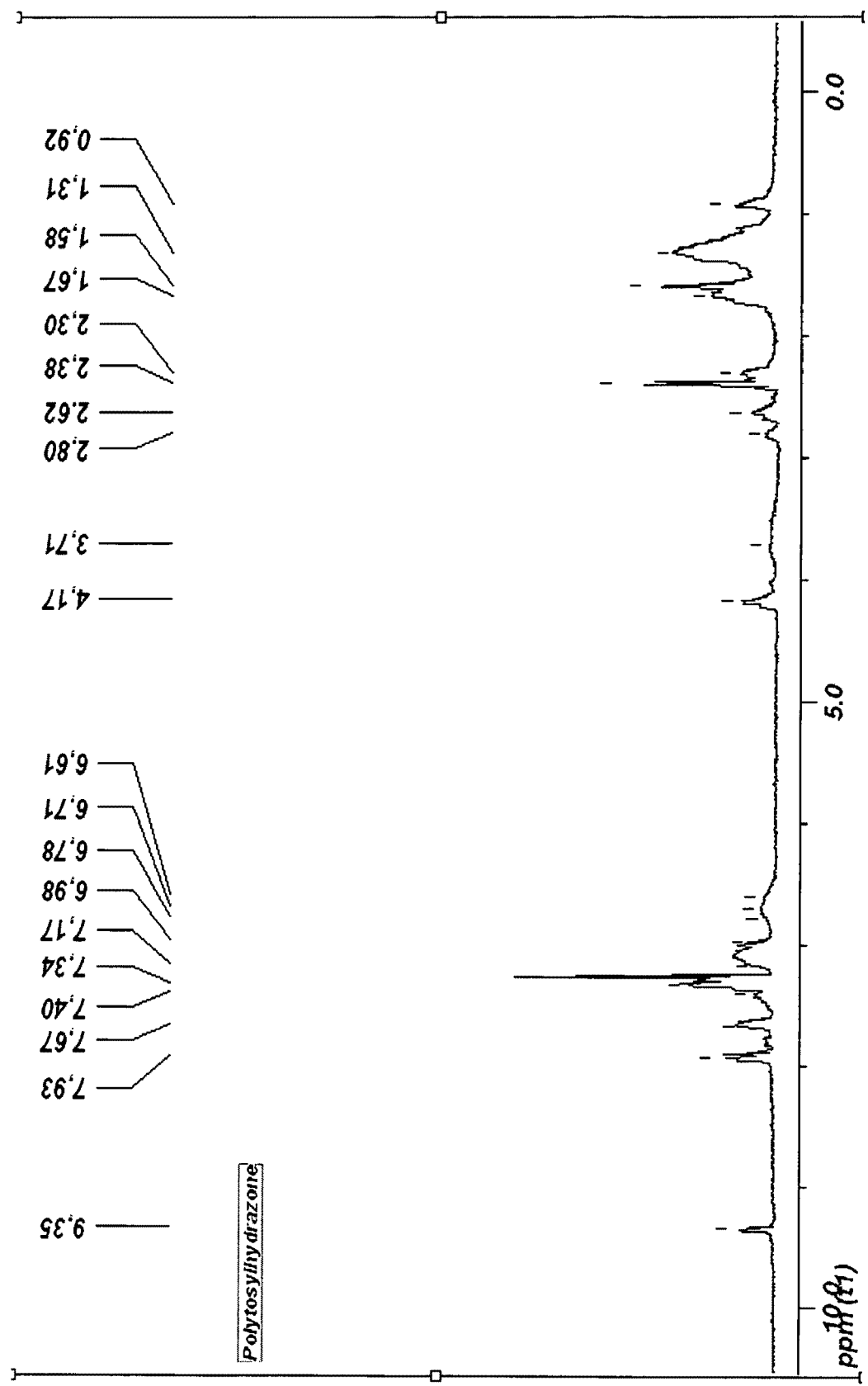
FIG. 14 shows a $^1$H and $^{13}$C NMR spectra of Polytosylhydrazone.
Figure 15:
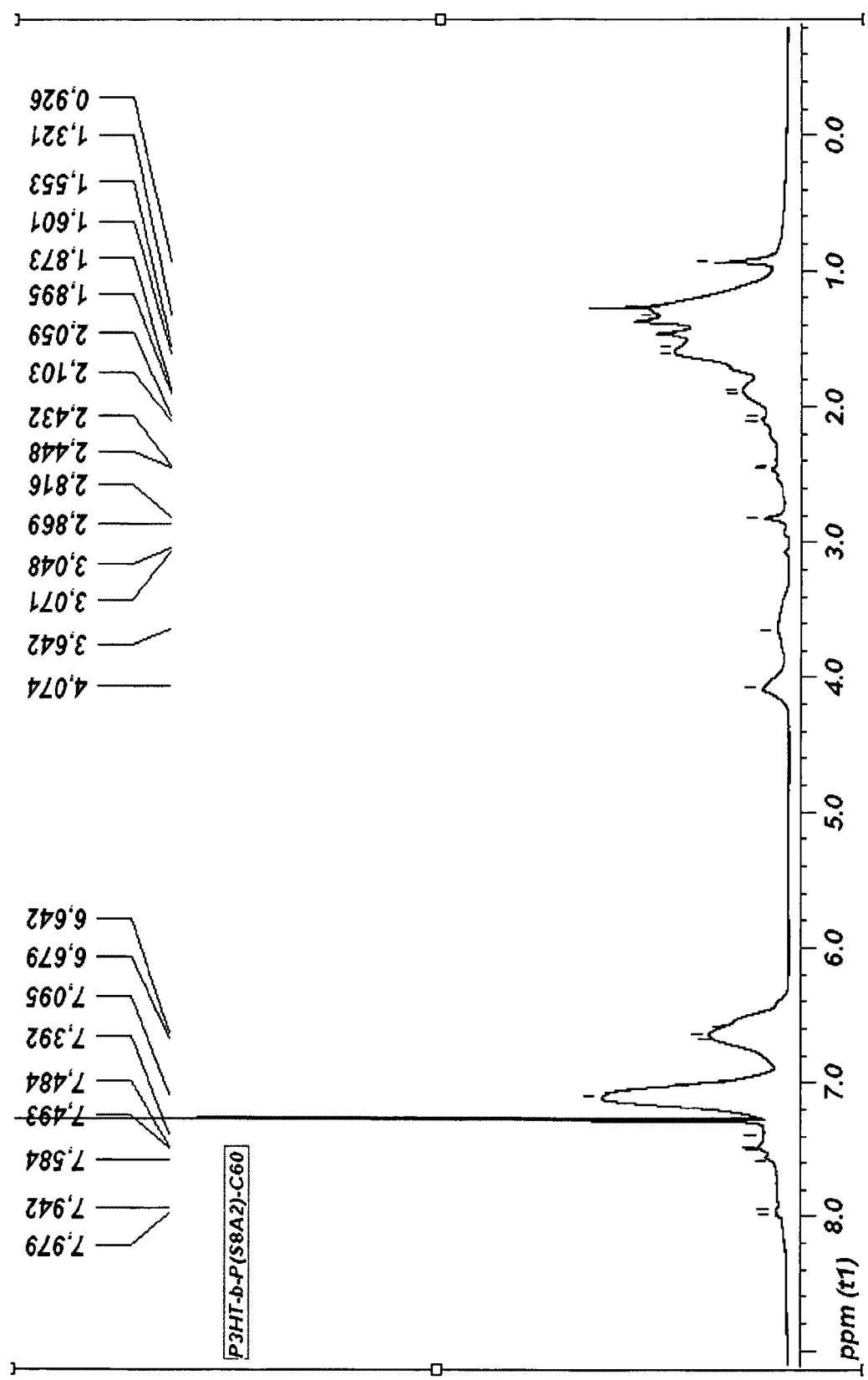
FIG. 15 shows a $^1$H and $^{13}$C NMR spectra of P3HT-b-P(S$_8$A$_2$)-C60.
Figure 16:
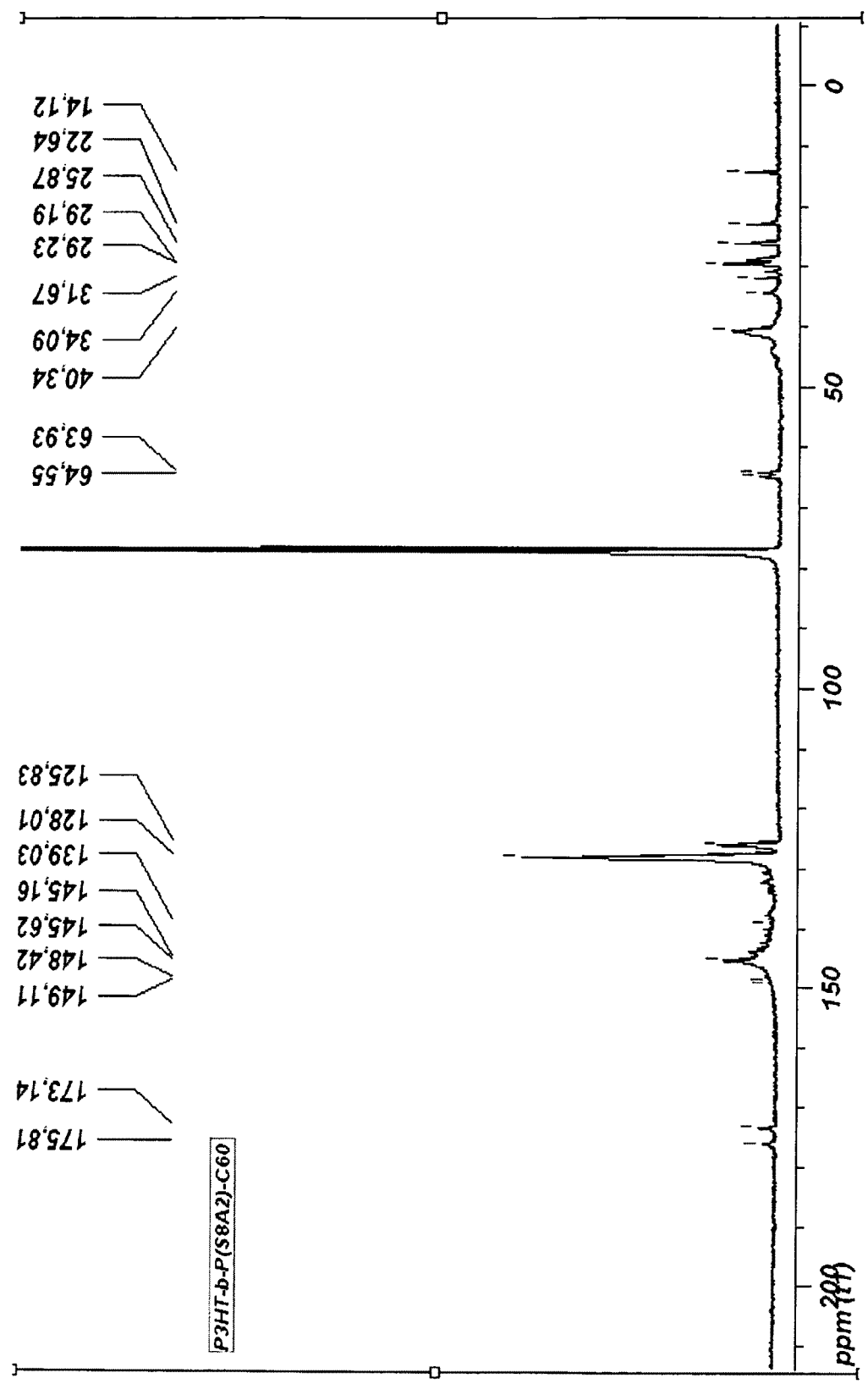
FIG. 16 shows a $^1$H and $^{13}$C NMR spectra of P3HT-b-P(S$_8$A$_2$)-C60 (continued).

We have shown, therefore, that the surfactant-like property of P3HT-b-P($S_8A_2$)-$C_{60}$ can affect the phase segregation within a P3HT:PCBM blend. To determine the effect of the surfactant on the performance of P3HT:PCBM solar cells, devices with P3HT-b-P($S_8A_2$)-$C_{60}$ as an additive (0, 5, 10, and 20 wt. %, respectively) were fabricated (FIG. 7), as described in detail in the Experimental section. Post-production annealing at high temperature (~150° C.) was performed since it has been shown to be an efficient method for improving the electrical characteristics of P3HT:PCBM-based solar cells. Performance optimization involved over 500 devices made from over 100 independently prepared P3HT:PCBM blends. The data points from optimized devices on FIG. 7 are representative; variations were within ±15%, an error range that resulted from the poor uniformity of the BHJ film formed during slow drying process. The optimum thickness of the BHJ films obtained under these conditions was approximately 300 nm. All data were obtained under white light AM1.5G illumination from a calibrated solar simulator with irradiation intensity of 100 mW/cm².

For comparison of the efficiencies upon addition of P3HT-b-P($S_8A_2$)-$C_{60}$, a device fabricated with only P3HT:PCBM in the active layer was used as a standard reference. The P3HT:PCBM device had a short circuit current density ($J_{sc}$ of 8.79 mA/cm², an open circuit voltage ($V_{oc}$) of 0.62V, and a fill factor (FF) of 48%, yielding a PCE ($\eta_e$) of 2.6%. Solar cells made with P3HT:PCBM processed with 5 wt. % P3HT-b-P($S_8A_2$)-$C_{60}$, showed a considerably improved $J_{sc}$=11.6 mA/cm², while the $V_{oc}$ (0.63 V) and FF (48%) remained similar to those of the devices without P3HT-b-P($S_8A_2$)-$C_{60}$. The corresponding PCE ($\eta_e$) was 3.5%, approximately 35% higher than obtained from a pristine P3HT:PCBM device. This positive effect in photocurrent can be ascribed to improvement in the bicontinuous interpenetrating networks of the BHJ composite due to the surfactant effect from the diblock copolymer. This conclusion is supported by features observed in the AFM. Increasing the amount of the P3HT-b-P($S_8A_2$)-$C_{60}$ in the blend film to 10 wt. %, lowers the $J_{sc}$ value and leads to an overall decrease in PCE ($\eta_e$) to 3.1%. The performance of the BHJ solar cells processed with 20 wt. % P3HT-b-P($S_8A_2$)-$C_{60}$ was markedly lower. Such deterioration in the photocurrent is likely the origin of the aggressive phase segregation observed in the film morphology. Additionally, we cannot rule out that in the presence of large amounts of P3HT-b-P($S_8A_2$)-$C_{60}$, resulting from non-conjugated units in the P3HT-b-P($S_8A_2$)-$C_{60}$. We are currently studying the surfactant effect of the block copolymer in device efficiency of BHJ solar cells with different component materials as a route toward a logical design to improve the device performance.

In summary, well-defined "donor-acceptor rod-coil" diblock copolymers comprising P3HT as donor and $C_{60}$ as acceptor blocks (P3HT-b-P($S_xA_y$)-$C_{60}$) have been synthesized by a straightforward synthetic strategy of living polymerization and subsequent cycloaddition. In spite of the bulky, rigid $C_{60}$ units in the coil segments, the resulting copolymer exhibits a long-range nanofibrilar structure, similar to those of typical rod-coil block copolymers. This is the first time that the formation of nanofibrils has been demonstrated in a block copolymer bearing $C_{60}$. By adding small amounts of the diblock copolymer to P3HT:PCBM, the interfacial morphology between the two immiscible components can be altered, resulting in a noticeable difference in phase segregation of the BHJ films. The characteristics of the solar cells were evaluated by the addition of various amount of the diblock copolymer (0, 5, 10, and 20 wt. %, respectively) as a processing surfactant in the BHJ system (P3HT:PCBM, 1:0.7 w/w). The BHJ device obtained by adding 5% diblock copolymer afforded a significant enhancement of $J_{sc}$ by creating suitable phase domains, leading to about 35% increase in PCE ($\eta_e$) to 3.5%, when compared to the reference cell without the surfactant. Studies are underway to further optimize and clarify the surfactant effect of the diblock copolymer in a variety of BHJ configurations that may lead to improved PCE ($\eta_e$). The use of new block copolymers as additives provides an important opportunity for control of the BHJ morphology.

Experimental Section

General

All solvents were purified and freshly distilled prior to use, following literature procedures. The synthesis of 3-benzylsulfanylthiocarbonylsulfanylpropionic acid chloride[38] and trithiocarbonate terminated poly(3-hexylthiophene) (macro-RAFT agent)[25] were also adapted from the literature procedures. Commercially available materials were used as received unless noted. $^1$H and $^{13}$C NMR spectra were recorded on a Varian Mercury V×200 MHz or Varian Unity Inova 500 MHz spectrometer and referenced to the solvent peak. Mass spectrometry and elemental analysis were performed by the UC Santa Barbara Mass Spectrometry Lab and elemental analysis center.

Device Fabrication

The BHJ films were prepared under optimized conditions according to the following procedure reported previously: The indium tin oxide (ITO)-coated glass substrate was first cleaned with detergent, ultrasonicated in acetone and isopropyl alcohol, and subsequently dried overnight in an oven. Poly(3,4-ethylenedioxythiophene):poly(styrenesulfonate) PEDOT:PSS (Baytron PH) in aqueous solution was spin-cast to form a film with thickness of approximately 40 nm. The substrate was dried for 10 min at 140° C. in air, then transferred into a glove-box to spin-cast the photoactive layer. A solution containing a mixture of 1 wt. % P3HT:PCBM (1:0.7 w/w) in chlorobenzene with varying additive weight concentration from 0 to 20 wt. % additives was then spin-cast on top of the PEDOT layer. Then, the device was pumped down to lower than $10^{-7}$ torr and a ~100 nm thick Al electrode was deposited on top.

8-Bromooctyl benzoylbutyrate (1)

A mixture of benzoylbutyric acid (9.0 g, 46.8 mmol), 1,8-dibromooctane (31.5 g, 117.0 mmol), potassium carbonate (16.4 g, 117.0 mmol), dry DMF (70 mL), and a catalytic amount of tetra-n-butylammonium iodide (1.0 mol %) was stirred and heated at 50° C. overnight. The solvent was evaporated. The residue was washed with dilute HCl and then extracted into ether, washed with brine, and dried with $MgSO_4$. The solvent and excess 1,8-dibromooctane were removed under reduced pressure. The crude product was chromatographed on silica using 0-20% ethyl acetate in hexane. Isolated yield=13.5 g (75%) as a colorless liquid. $^1$H NMR ($CDCl_3$, 200 MHz): δ ppm 7.95 (dd, J=8.24, 1.49 Hz, 2H), 7.47 (m, 3H), 4.05 (t, J=6.64 Hz, 2H), 3.37 (t, J=6.81, 2H), 3.04 (t, J=7.13 Hz, 2H), 2.42 (t, J=7.20 Hz, 2H), 2.01 (m, 2H), 1.82-1.73 (m, 2H), 1.69-1.51 (m, 2H), 1.47-1.21 (m, 8H). $^{13}$C NMR ($CDCl_3$, 50.28 MHz): δ 199.29, 173.25, 136.75, 133.00, 128.52, 127.94, 64.41, 37.40, 33.90, 33.34, 32.67, 28.96, 28.50, 27.97, 25.76, 19.34. HRMS (EI) m/z: 405 (($M+Na$)$^{+\cdot}$). Elemental analysis: Calculated for $C_{19}H_{27}BrO_3$: C, 59.53; H, 7.10; Br, 20.85; O, 12.52. Found: C, 59.77; H, 7.52.

8-Acryloyloxyoctyl benzoylbutyrate (2)

A mixture of compound 1 (8.0 g, 20.0 mmol), potassium carbonate (2.25 g, 30.0 mmol), dry DMF (35 mL), and a catalytic amount of tetra-n-butylammonium iodide (1.0 mol %) was stirred and heated at 50° C. overnight. The solvent was evaporated. The residue was washed with dilute HCl and then extracted into ether, washed with brine, and dried with $MgSO_4$. The crude product was chromatographed on silica using 0-20% ethyl acetate in hexane. Isolated yield=6.0 g (80%) as a colorless oil. $^1$H NMR ($CDCl_3$, 200 MHz): δ ppm 7.95 (d, J=6.11 Hz, 2H), 7.67-7.17 (m, 3H), 6.39 (d, J=16.11 Hz, 1H), 6.26-5.99 (m, 1H), 5.86 (dd, J=23.61, 10.04 Hz, 1H), 4.36-3.86 (m, 4H), 3.01 (m, 2H), 2.43 (m, 2H), 2.02 (m, 2H), 1.72-1.51 (m, 4H), 1.37-1.21 (s, 8H). $^{13}$C NMR ($CDCl_3$, 50.28 MHz): δ 199.32, 173.28, 166.24, 136.76, 133.00, 130.39, 128.53, 127.96, 64.41, 37.41, 33.34, 29.03, 28.50, 25.78, 19.36. HRMS (EI) m/z: 397 (($M+Na$)$^{+\cdot}$). Elemental analysis: Calculated for $C_{22}H_{30}O_5$: C, 70.56; H, 8.07; O, 21.36. Found: C, 71.00; H, 7.95.

Allyl Terminated P3HT.

A dry Schlenk flask was flame-dried under vacuum and was charged with 2,5-dibromo-3-hexylthiophene (5 g, 15.32 mmol), Ni(dppp)$Cl_2$ (0.248 g, 510 mmol) and anhydrous THF (100 mL). The flask was evacuated and purged with argon three times. The reaction was placed in an ice-water bath and then a 1 M solution of i-PrMgCl.LiCl (15.5 mL, 15.5 mmol) was added dropwise manually via syringe over 20 minutes. The polymerization was allowed to proceed for 1 h at 0° C. followed by the addition of a 1 M solution of allyl magnesium bromide (10 mL, 10 mmol). The reaction mixture was stirred for an additional 30 minutes followed by quenching with MeOH (200 mL). The resulting solid was filtered off and subjected to sequential Soxhlet extraction with methanol (1 d), acetone (1 d), and hexane (1 d) to remove the low molecular weight fractions. The residue was extracted with THF to give a dark reddish product after precipitating again from methanol and drying in vacuo. GPC analysis $M_n$=8,320 g/mol, $M_w$=9,250 g/mol, and PDI=1.1 (against PS standard). The NMR spectrum is identical to that of the literature described previously.[25,37]

Procedure for RAFT Polymerization.

Trithiocarbonate terminated P3HT as a macro-RAFT agent (0.10 g, ~12 μmol estimated by GPC result), AIBN (0.75 mg, 4.5 pump as a initiator, and anhydrous toluene (2.5 mL) were mixed in a Schlenk flask which then was purged with argon for 15 minutes. To this solution, an appropriate feed ratio of styrene to acrylate monomer 2 and anhydrous toluene (3 mL) were added and the mixture was degassed by freeze-pump-thaw cycles (3×), and the back-filled with dry argon. The mixture was immersed in an oil bath at 75° C. for 24 h. The polymer solution was transferred to a centrifuge tube, precipitated with MeOH (200 mL), centrifuged, and decanted. The crude product was treated with MeOH twice in the same manner and subjected to Soxhlet extraction with hexane (1 d). Then, the residue was redissolved in hot ethyl acetate and filtered to remove the trace amounts of unreacted P3HT since the P3HT was not completely soluble in ethyl acetate, and then the filtrate was evaporated. After redissolved in THF, the polymer was again precipitated into hexane, centrifuged, decanted, washed with MeOH, and dried in vacuo to give a viscous reddish polymer. Representative $^1$H NMR (CDCl$_3$, 200 MHz): δ ppm 7.97 (br, d), 7.66-7.33 (br, m), 7.18-6.90 (br, m), 6.82-6.40 (br, s), 4.07 (br, m), 3.79-3.34 (br, s), 3.06 (br, m), 2.81 (br, s), 2.44 (br, m), 2.09 (br, m), 1.83-1.17 (br, m), 0.93 (br, m).

P3HT-b-P(S$_6$A$_4$): Styrene (0.7 g, 6.73 mmol) and acrylate monomer 2 (1.68 g, 4.48 mmol) were used, following the procedure as well as purification described above.

GPC analysis M$_n$=23,110 g/mol, M$_w$=36,720 kg/mol, and PDI=1.59 (against PS standard).

P3HT-b-P(S$_8$A$_2$): Styrene (1.5 g, 14.42 mmol) and acrylate monomer 2 (1.35 g, 3.60 mmol) were used, following the procedure as well as purification described above.

GPC analysis M$_n$=18,530 g/mol, M$_w$=29,750 kg/mol, and PDI=1.61 (against PS standard).

Polytosylhydrazones.

The block copolymers (P3HT-b-P(S$_x$A$_y$)), p-toluene-sulfonyl hydrazide (5.0 equiv relative to the built-in amount of coil blocks), and THF (50 mL) were stirred and refluxed overnight. The polymer solution was transferred to a centrifuge tube, precipitated with MeOH (200 mL), centrifuged, and decanted. The crude product was treated with MeOH twice in the same manner, washed with MeOH, collected by filtration, and dried in vacuo to give a reddish solid polymer. Representative $^1$H NMR (CDCl$_3$, 200 MHz): δ ppm 9.35 (br, s), 7.93 (br, d), 7.65 (br, m), 7.40-7.25 (br, m), 7.19-6.91 (br, m), 6.85-6.43 (br, s), 4.17 (br, m), 3.81-3.29 (br, s), 2.81 (br, s), 2.64 (br, m), 2.41-2.21 (br, m), 1.79-1.12 (br, m), 0.89 (br, m).

Donor-Acceptor Rod-Coil Diblock Copolymers (P3HT-b-P(S$_x$A$_y$)-C$_{60}$).

A similar procedure for the synthesis of PCBM derivatives as reported in our group[7] was used. A mixture of polytosylhydrazone (360 mg), sodium methoxide (36 mg, 0.66 mmol), and dry pyridine (20 mL) was placed under argon and stirred at RT for 30 min. To the mixture, a solution of C$_{60}$ (0.28 g, 0.39 mmol) in o-DCB (100 mL) was added, and the homogeneous reaction mixture was stirred at 70° C. under argon for 2 d. The solution was heated to reflux and allowed to continue overnight again. The resulting mixture was concentrated in vacuo and precipitated into MeOH (200 mL). The crude product was subjected to Soxhlet extraction with MeOH for 1 d and hexane for 7 d. The residue was redissolved in THF (500 mL) and filtered (five times). The filtrate was evaporated and washed with hexane (twice). The crude product was redissolved in THF (500 mL) and filtered by using a micron filter (0.45 µm) twice, and then evaporated. The obtained residue was redissolved in o-DCB and precipitated into hot hexane (200 mL), which was repeated until the disappearance (TLC) of the unreacted C$_{60}$ (about five times). The product was collected and dried to give a reddish brown polymer.

P3HT-b-P(S$_8$A$_2$)-C$_{60}$: $^1$H NMR (CDCl$_3$, 500 MHz): δ ppm 7.97 (br, d), 7.55-7.33 (br, m), 7.17-6.91 (br, m), 6.81-6.32 (br, s), 4.07 (br, m), 3.81-3.25 (br, s), 3.07 (br, s), 2.81 (br, s), 2.54-2.30 (br, m), 2.19-2.02 (br, m), 1.93-1.11 (br, m), 0.93 (br, m). $^{13}$C NMR (CDCl$_3$, 125.70 MHz, see Supporting Information for the spectrum).

Acknowledgements: Synthesis and characterization were supported by MC-CAM.

REFERENCES (1) Shaheen, S. E.; Ginley, D. S.; Jabbour, G. E. *MRS Bull.* 2005, 30, 10.

(2) Günes, S.; Neugebauer, H.; Sariciftci, N. S. *Chem. Rev.* 2007, 107, 1324.

(3) Kim, J. Y.; Kim, S. H.; Lee, H.-H.; Lee, K.; Ma, W.; Gong, X.; Heeger, A. J. *Adv. Mater.* 2006, 18, 572.

(4) Li, G.; Shrotriya, V.; Huang, J.; Yao, Y.; Moriarty, T.; Emery, K.; Yang, Y. *Nature Mater.* 2005, 4, 864.

(5) Ma, W.; Yang, C.; Gong, X.; Lee, K.; Heeger, A. J. *Adv. Funct. Mater.* 2005, 15, 1617.

(6) Reyes-Reyes, M.; Kim, K.; Carroll, D. L. *Appl. Phys. Lett.* 2005, 87, 083506.

(7) Yang, C.; Kim, J. Y.; Cho, S.; Lee, J. K.; Heeger, A. J.; Wudl, F. *J. Am. Chem. Soc.* 2008, 130, 6444.

(8) Zhang, F. L.; Perzon, E.; Wang, X. J.; Mammo, W.; Andersson, M. R.; Inganäs, O. *Adv. Funct. Mater.* 2005, 15, 745.

(9) Muhlbacher, D.; Scharber, M.; Morana, M.; Zhu, Z. G.; Waller, D.; Gaudiana, R.; Brabec, C. *Adv. Mater.* 2006, 18, 2931.

(10) Backer, S. A.; Sivula, K.; Kavulak, D. F.; Frechet, J. M. J. *Chem. Mater.* 2007, 19, 2927.

(11) Peet, J.; Kim, J. Y.; Coates, N. E.; Ma, W. L.; Moses, D.; Heeger, A. J.; Bazan, G. C. *Nature Mater.* 2007, 6, 497.

(12) Lee, J. K.; Ma, W. L.; Brabec, C. J.; Yuen, J.; Moon, J. S.; Kim, J. Y.; Lee, K.; Bazan, G. C.; Heeger, A. J. *J. Am. Chem. Soc.* 2008, 130, 3619.

(13) Al-Ibrahim, M.; Ambacher, O.; Sensfuss, S.; Gobsch, G. *Appl. Phys. Lett.* 2005, 86, 201120.

(14) Padinger, F.; Rittberger, R. S.; Sariciftci, N. S. *Adv. Funct. Mater.* 2003, 13, 85.

(15) Chirvase, D.; Parisi, J.; Hummelen, J. C.; Dyakonov, V. *Nanotechnology* 2004, 15, 1317.

(16) Yang, X. N.; Loos, J.; Veenstra, S. C.; Verhees, W. J. H.; Wienk, M. M.; Kroon, J. M.; Michels, M. A. J.; Janssen, R. A. J. *Nano Lett.* 2005, 5, 579.

(17) Erb, T.; Zhokhavets, U.; Gobsch, G.; Raleva, S.; Stühn, B.; Schilinsky, P.; Waldauf, C.; Brabec, C. J. *Adv. Funct. Mater.* 2005, 15, 1193.

(18) Klok, H. A.; Lecommandoux, S. *Adv. Mater.* 2001, 13, 1217.

(19) Jenekhe, S. A.; Chen, X. L. *Science* 1998, 279, 1903.

(20) Olsen, B. D.; Segalman, R. A. *Macromolecules* 2007, 40, 6922.

(21) Lee, M.; Cho, B. K.; Zin, W. C. *Chem. Rev.* 2001, 101, 3869.

(22) Stupp, S. I. *Curr. Opin. Colloid Interface Sci.* 1998, 3, 20.

(23) Gallot, B. *Prog. Polym. Sci.* 1996, 21, 1035.

(24) Liu, J. S.; Sheina, E.; Kowalewski, T.; McCullough, R. D. *Angew. Chem., Int. Ed.* 2002, 41, 329.

(25) Iovu, M. C.; Craley, C. R.; Jeffries-El, M.; Krankowski, A. B.; Zhang, R.; Kowalewski, T.; McCullough, R. D. *Macromolecules* 2007, 40, 4733.

(26) Sivula, K.; Ball, Z. T.; Watanabe, N.; Frechet, J. M. J. *Adv. Mater.* 2006, 18, 206.

(27) de Cuendias, A.; Le Hellaye, M.; Lecommandoux, B.; Cloutet, E.; Cramail, H. *J. Mater. Chem.* 2005, 15, 3264.

(28) Radano, C. P.; Scherman, O. A.; Stingelin-Stutzmann, N.; Müller, C.; Breiby, D. W.; Smith, P.; Janssen, R. A. J.; Meijer, E. W. *J. Am. Chem. Soc.* 2005, 127, 12502.

(29) van der Veen, M. H.; de Boer, B.; Stalmach, U.; van de wetering, K. I.; Hadziioannou, G. *Macromolecules* 2004, 37, 3673.

(30) Stalmach, U.; de Boer, B.; Videlot, C.; van Hutten, P. F.; Hadziioannou, G. *J. Am. Chem. Soc.* 2000, 122, 5464.

(31) Barrau, S.; Heiser, T.; Richard, F.; Brochon, C.; Ngov, C.; van de Wetering, K.; Hadziioannou, G.; Anokhin, D. V.; Ivanov, D. A. *Macromolecules* 2008, 41, 2701.

(32) de Boer, B.; Stalmach, U.; van Hutten, P. F.; Melzer, C.; Krasnikov, V. V.; Hadziioannou, G. *Polymer* 2001, 42, 9097.

(33) Chiefari, J.; Chong, Y. K.; Ercole, F.; Krstina, J.; Jeffery, J.; Le, T. P. T.; Mayadunne, R. T. A.; Meijs, G. F.; Moad, C. L.; Moad, G.; Rizzardo, E.; Thang, S. H. *Macromolecules* 1998, 31, 5559.

(34) Matyjaszewski, K.; Davis, T. P. *Handbook of Radical Polymerization*; Wiley-Interscience: Hoboken, N.J., 2002.

(35) Le, T. P.; Moad, G.; Rizzardo, E.; Thang, S. H. International Patent, 1998; Vol. WO 9801478.

(36) Krasovskiy, A.; Knochel, P. *Angew. Chem., Int. Ed.* 2004, 43, 3333.

(37) Jeffries-El, M.; Sauvé, G.; McCullough, R. D. *Macromolecules* 2005, 38, 10346.

(38) Stenzel, M. H.; Davis, T. P.; Fane, A. G. *J. Mater. Chem.* 2003, 13, 2090.

(39) Camp, A. G.; Lary, A.; Ford, W. T. *Macromolecules* 1995, 28, 7959.

(40) Tan, Z.; Hou, J. H.; He, Y. J.; Zhou, E. J.; Yang, C. H.; Li, Y. F. *Macromolecules* 2007, 40, 1868.

(41) Ruoff, R. S.; Tse, D. S.; Malhotra, R.; Lorents, D. C. *J. Phys. Chem.* 1993, 97, 3379.

(42) Beck, M. T.; Mándi, G. *Fullerene Sci. Technol.* 1997, 5, 291.

(43) Liu, B.; Bunker, C. E.; Sun, Y. P. *Chem. Commun.* 1996, 1241.

(44) Spanggaard, H.; Krebs, F. C. *Sol. Energ. Mat. Sol. C.* 2004, 83, 125.

(45) Bahadur, P. *Curr. Sci. India* 2001, 80, 1002.

(46) Ni, P. H.; Zhang, M. Z.; Zhuge, L. J.; Fu, S. K. *J. Polym. Sci. Pol. Chem.* 2002, 40, 3734.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the following claims.

The invention claimed is:

1. An organic photovoltaic device comprising a layer comprising P3HT (poly(3-hexyl)thiophene), PCBM (phenyl C61-butyric acid methyl ester), and P3HT-b-P($S_xA_y$)-$C_{60}$, wherein S is styrene and A is acrylate, x is the mol ratio of S and y is the mol ratio of A wherein said P3HT-b-P($S_xA_y$)-$C_{60}$ interfaces between the P3HT and PCBM; thereby leading to improve performance of the photovoltaic device.

2. The device of claim 1, wherein % wt of P3HT, % wt of PCBM in % wt solution, % wt of P3HT-b-P($S_xA_y$)-$C_{60}$ per the amount of P3HT is 1-10; 0.1-10; 0.1-5 and 1-20, respectively, wherein the % wt solution is the concentration of PCBM in its solvent.

3. The device of claim 1, wherein % wt of P3HT, % wt of PCBM in % wt solution, % wt of P3HT-b-P($S_xA_y$)-$C_{60}$ per the amount of P3HT is 1, 0.7, 1, and 5, respectively, wherein the % wt solution is the concentration of PCBM in its solvent.

4. The device of claim 1, wherein the device is a bulk-heterojunction solar cell.

5. A composition comprising P3HT (poly(3-hexyl)thiophene), PCBM (phenyl C61-butyric acid methyl ester), and P3HT-b-P($S_xA_y$)-$C_{80}$, wherein S is styrene and A is acrylate, x is the mol ratio of S and y is the mol ratio of A.

6. The composition of claim 5 wherein % wt of P3HT, % wt of PCBM in % wt solution, % wt of P3HT-b-P($S_xA_y$)-$C_{60}$ per the amount of P3HT is 1-10; 0.1-10; 0.1-5 and 1-20, respectively, wherein the % wt solution is the concentration of PCBM in its solvent.

7. The composition of claim 5 wherein % wt of P3HT, % wt of PCBM in % wt solution, % wt of P3HT-b-P($S_xA_y$)-$C_{60}$ per the amount of P3HT is 1, 0.7, 1, and 5, respectively, wherein the % wt solution is the concentration of PCBM in its solvent.

8. A diblock copolymer comprising the formula of P3HT-b-P($S_xA_y$)-$C_{60}$, wherein S is styrene and A is acrylate, x is the mol ratio of S in the copolymer and y is the mol ratio of A in the copolymer, whereby the diblock is sufficiently soluble to be cast as a thin film.

9. The copolymer of claim 8 wherein % mol of P3HT (poly(3-hexyl)thiophene), % mol of PS, % mol of PA, and % wt of $C_{60}$ is 10-20, 50-80, 10-40, and 30-50, respectively.

10. The copolymer of claim 8, wherein, wherein the diblock expresses a nanofibrilar structure.

11. The diblock of claim 8, wherein x is 80 and y is 20.

12. A method for the synthesis of P3HT-b-P($S_xA_y$)-$C_{60}$ diblock comprising:
undergoing a living polymerization reaction
performing cycloaddition reactions; and performing the following reactions:

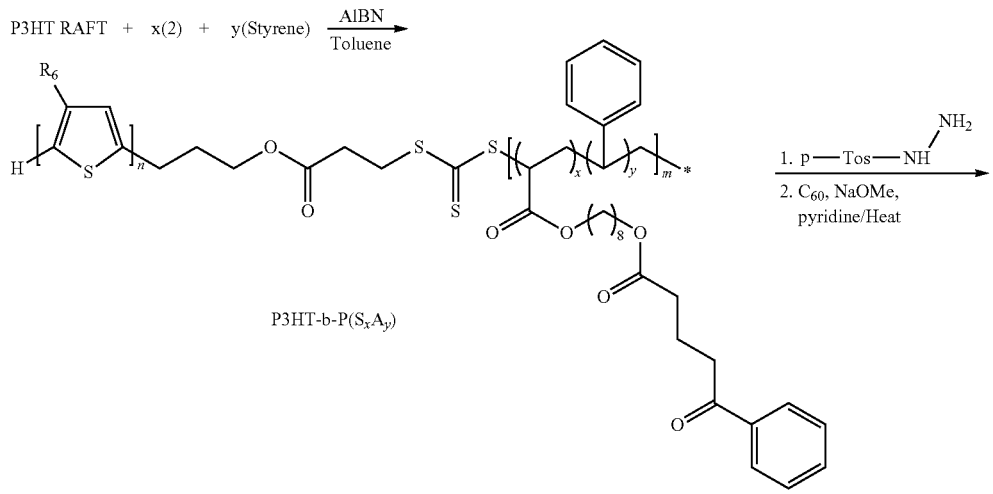

-continued

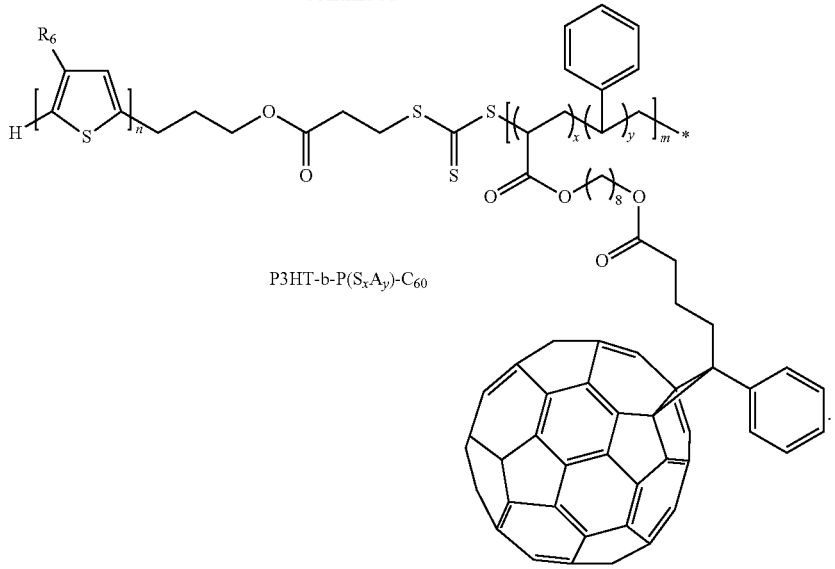

P3HT-b-P($S_xA_y$)-$C_{60}$

13. The method of claim 12, whereby a nanofibrilar structure is formed.

14. A method of using a diblock compound to interface between P3HT (poly(3-hexyl)thiophene) and PCBM (phenyl C61-butyric acid methyl ester) layers, comprising mixing said diblock with said P3HT and PCBM compounds, wherein said diblock comprises the formula of P3HT-b-P($S_xA_y$)-$C_{60}$ wherein S is styrene and A is acrylate, x is the mol ratio of S and y is the mol ratio of A.

15. The method of claim 14 wherein the % wt of P3HT, % wt of PCBM in % wt solution, % wt of P3HT-b-P($S_xA_y$)-$C_{60}$ per the amount of P3HT is 1-10; 0.1-10; 0.1-5 and 1-20, respectively, wherein the % wt solution is the concentration of PCBM in its solvent.

16. A diblock copolymer comprising the formula of P3HT-b-P($S_xA_y$)-$C_{60}$, wherein S is styrene and A is acrylate, x is the mol ratio of S in the copolymer and y is the mol ratio of A in the copolymer, whereby the diblock is sufficiently soluble to be cast as a thin film, wherein % mol of P3HT (poly(3-hexyl) thiophene), % mol of PS, % mol of PA, and % wt of $C_{60}$ is 10-20, 50-80, 10-40, and 30-50, respectively.

17. A diblock copolymer comprising the formula of P3HT-b-P($S_xA_y$)-$C_{60}$, wherein S is styrene and A is acrylate, x is the mol ratio of S in the copolymer and y is the mol ratio of A in the copolymer, whereby the diblock is sufficiently soluble to be cast as a thin film, wherein x is 80 and y is 20.

* * * * *